United States Patent
Ding et al.

(10) Patent No.: US 10,050,638 B2
(45) Date of Patent: Aug. 14, 2018

(54) METHOD OF GAIN CALIBRATION IN A SUCCESSIVE APPROXIMATION REGISTER ANALOG-TO-DIGITAL CONVERTER AND A SUCCESSIVE APPROXIMATION REGISTER ANALOG-TO-DIGITAL CONVERTER

(71) Applicant: Stichting IMEC Nederland, Eindhoven (NL)

(72) Inventors: Ming Ding, Eindhoven (NL); Pieter Harpe, Eindhoven (NL); Hanyue Li, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 15/835,310

(22) Filed: Dec. 7, 2017

(65) Prior Publication Data

US 2018/0175874 A1    Jun. 21, 2018

(30) Foreign Application Priority Data

Dec. 8, 2016   (EP) .................................... 16202934

(51) Int. Cl.
*H03M 1/10*   (2006.01)
(52) U.S. Cl.
CPC ................................ *H03M 1/1009* (2013.01)
(58) Field of Classification Search
CPC ................................................ H03M 1/1009
(Continued)

(56) References Cited

U.S. PATENT DOCUMENTS 5,272,481 A * 12/1993 Sauer ................... H03M 1/0602
                                                              327/63
7,378,999 B1 * 5/2008 McGrath ............. H03M 1/1028
                                                             341/120

(Continued)

FOREIGN PATENT DOCUMENTS

EP     3059867         8/2016
WO    WO 2012/123578   9/2012

OTHER PUBLICATIONS

Chen, Jingyuan et al., "A 14-bit Column-Parallel Two-Step SA ADC with On-Chip Scaled Reference Voltages Self-Calibration for CMOS Image Sensor" 2016 IEEE International Conference on Electron Devices and Solid-State Circuits; pp. 326-329; 4 pgs.

(Continued)

*Primary Examiner* — Lam T Mai
(74) *Attorney, Agent, or Firm* — Knobbe, Martens, Olson & Bear, LLP

(57) ABSTRACT

A method of gain calibration in a SAR ADC is disclosed. In one aspect, the method comprises determining a number of bits of an analog input signal ($V_{IN}$), detecting if a binary code determined from the analog input signal ($V_{IN}$) matches at least one trigger code, using at least one setting code to determine a calibration residue signal ($V^*_{RES}$) and a calibration bit ($B^*_{LSB}$), analyzing a least significant bit of the digital signal ($C_{OUT}$) and the calibration bit ($B^*_{LSB}$), determining an indication of a presence of gain error in the gain module, and calibrating the gain error. As the determination of the calibration bit ($B^*_{LSB}$) requires only one additional comparison, as compared to normal operation, the normal operation does not need to be interrupted. Therefore, the calibration can be done in the background and, as such, can be performed frequently thereby taking into account time-varying changes due to environmental effects.

20 Claims, 13 Drawing Sheets

(58) Field of Classification Search
USPC .................................................. 341/120–155
See application file for complete search history.

(56) References Cited

U.S. PATENT DOCUMENTS

| | | | | |
|---|---|---|---|---|
| 9,432,044 | B1* | 8/2016 | Lee | H03M 1/1061 |
| 9,584,150 | B2* | 2/2017 | Bogner | H03M 1/1014 |
| 9,602,119 | B1* | 3/2017 | Maulik | H03M 1/1014 |
| 9,954,549 | B2* | 4/2018 | Venca | H03M 1/667 |
| 2005/0275578 | A1* | 12/2005 | Bjornsen | H03M 1/0641 |
| | | | | 341/155 |
| 2011/0102228 | A1* | 5/2011 | Anthony | H03M 1/0607 |
| | | | | 341/155 |
| 2011/0215957 | A1* | 9/2011 | Hummerston | H03M 1/12 |
| | | | | 341/155 |
| 2017/0012633 | A1* | 1/2017 | Venca | H03M 1/667 |
| 2017/0012637 | A1* | 1/2017 | Venca | H03M 1/667 |
| 2017/0012639 | A1* | 1/2017 | Bogner | H03M 1/1014 |
| 2017/0250702 | A1* | 8/2017 | Venca | H03M 1/667 |

OTHER PUBLICATIONS

Ding, Ming, et al., "A 5.5fJ/conv-step 6.4MS/s 13b SAR ADC Utilizing a Redundancy-Facilitated Background Error-Detection-and-Correction Scheme" IEEE International Solid-State Circuits Conference, 2015/Session 26/ NYQUIST-Rate Converters/26.2; pp. 460-462; 4 pgs.

Gurevich, Michael, "ADC Offset in MSC12xx Devices. Data Acquisition Products—Microsystems Group" Application Report for Texas Instruments; Jul. 2003, Revised Oct. 2003; 21 pgs.

Wang, Wuguang, et al., "A Digital Background Calibration Technique for Split DAC Based SAR ADC by Using Redundant Cycle," 2015 28$^{th}$ IEEE International System-On-Chip Conference, pp. 231-234; Sep. 8, 2015; 4 pgs.

Xu, Benwei, "Comprehensive Background Calibration of Time-Interleaved Analog-to-Digital Converters" IEEE Transactions on Circuits and Systems-I: Regular Papers, vol. 62, No. 5, pp. 1306-1314; May 2015; 9 pgs.

Zhong, Jianyu et al., "Inter-Stage Gain Error Self-Calibration of a 31.5fJ 10b 470 MS/s Pipelined-SAR ADC" IEEE Aslan Solid-State Circuits Conference, pp. 153-156; Nov. 12-14, 2012, Kobe, Japan; 4 pgs.

Zhou, Yuan, "A 12 bit 160 MS/s Two-Step SAR ADC with Background Bit-Weight Calibration Using a Time-Domain Proximity Detector" IEEE Journal of Solid-State Circuits, vol. 50, No. 4, Apr. 2015, pp. 920-931; 12 pgs.

European Search Report dated Jun. 20, 2017 in EP Application No. 16202934.2; 12 pgs.

* cited by examiner

METHOD OF GAIN CALIBRATION IN A SUCCESSIVE APPROXIMATION REGISTER ANALOG-TO-DIGITAL CONVERTER AND A SUCCESSIVE APPROXIMATION REGISTER ANALOG-TO-DIGITAL CONVERTER

CROSS-REFERENCE TO RELATED APPLICATIONS

This application claims foreign priority to European Patent Application No. EP 16202934.2, filed Dec. 8, 2016, which is incorporated by reference herein in entirety.

BACKGROUND

Field

The disclosed technology relates to a method of gain calibration in a successive approximation register analog-to-digital converter (SAR ADC). The disclosed technology also relates to a successive approximation register analog-to-digital converter.

Description of the Related Technology

Analog-to-digital converters (ADCs) are commonly known and are used as an interface between the analog front-end and the subsequent digital processing blocks. Modern wireless communication systems usually require a low power with a high resolution (i.e., between 12 to 14 bits). To provide a high enough power efficiency SAR ADCs are used as these are intrinsically power efficient. A downside of the SAR ADCs is that they are limited to only 8 to 12 bits of resolution due to DAC capacitor mismatch and comparator noise.

Recently, a two-stage pipelined SAR ADC has been proposed that could increase the resolution. The two-stage pipelined SAR ADC comprises two independent medium resolution SAR ADCs and an inter-stage residue amplifier. This pipelined structure relaxes the noise requirements on the second stage but imposes low noise and accurate gain conditions on the inter-stage amplifier.

A known issue with two-stage SAR ADCs, and in general with high resolution ADCs, is that they require a calibration to achieve the best performance. Specifically, the DACs in each stage need to be calibrated with respect to one another; the amplifier can have an offset that needs to be calibrated; the comparators in the each stage ADC can be offset; and the amplifier can have a gain error that needs to be calibrated. However, in two-stage SAR ADCs, the known calibration processes require the normal operation of the SAR ADC to be stopped. As such, the SAR ADC cannot continuously convert an input signal. Another advantage is that the known calibration processes do not take into account time-varying changes due to environmental effects.

SUMMARY OF CERTAIN INVENTIVE ASPECTS

An objective of certain aspects of the disclosed technology is to provide a method of gain calibration in a successive approximation register analog-to-digital converter (SAR ADC) which does not interrupt the normal operation of the SAR ADC.

For example, such objective is achieved by a method of gain calibration in a SAR ADC, the method comprising the steps of: (a) determining, by a first stage ADC, a number of most significant bits of a digital signal corresponding to an analog input signal; (b) amplifying, by a gain module, a residue signal output from the first stage ADC; (c) determining, by a second stage ADC, a number of least significant bits of the digital signal corresponding to the analog input signal; (d) detecting if a binary code determined from the analog input signal ($V_{IN}$) matches at least one trigger code; (e) using at least one setting code corresponding to the at least one trigger code to determine a calibration residue signal in the first stage ADC and a calibration bit in the second stage ADC; (f) analyzing a least significant bit of the digital signal and the calibration bit; (g) determining, from the analysis, an indication of a presence of gain error in the gain module; and (h) calibrating gain error in the gain module if the presence of gain error is determined.

Because the determination of the calibration bit requires only one additional comparison in the second stage ADC, when compared to the normal operation, there is no significant effect on the normal operation of the SAR ADC. Specifically, the normal operation does not need to be interrupted, there is simply one additional comparison step. Moreover, determining if there is a gain error and calibrating if there is an error are also not processes that affect the normal operation of the SAR ADC. As such, the calibration can be done in the background and, as such, can be performed frequently thereby taking into account time-varying changes due to environmental effects.

In an embodiment, step (e) further comprises determining the calibration residue signal by calculating a difference between the analog input signal and an analog signal representing a part of the at least one setting code.

In an embodiment, step (e) further comprises determining the calibration bit by comparing an amplified calibration residue signal to a further analog signal representing a part of the at least one setting code.

In an embodiment, step (e) further comprises temporarily storing, by the gain module, the calibration residue signal until the least significant bit has been determined.

In an embodiment, step (g) further comprises determining if the least significant bit and the calibration bit are different indicating the presence of gain error in the gain module. In one aspect, step (g) further comprises determining the value of the least significant bit, and, if it has a value of '1', indicating a downwards calibration, and, if it has a value of '0', indicating an upwards calibration.

In an alternative embodiment, step (g) further comprises determining the value of the least significant bit and of the calibration bit, and, if the value of both the least significant bit and the calibration bit is '0', not indicating the presence of gain error in the gain module, and, if the value of both the least significant bit and the calibration bit is '1', not indicating the presence of gain error in the gain module, and if the value of the least significant bit is '0' and the value of the calibration bit is '1', indicating the presence of gain error in the gain module with an upwards calibration, and if the value of the least significant bit is '1' and the value of the calibration bit is '0', indicating the presence of gain error in the gain module with a downwards calibration.

In an embodiment, step (h) further comprises, if the presence of gain error in the gain module is detected, calibrating the second stage ADC by adjusting at least one of a plurality of tunable capacitors.

Another objective of the disclosed technology to provide a successive approximation register analog-to-digital converter (SAR ADC) which can undergo a gain error calibration without interrupting the normal operation of the SAR ADC.

This objective is achieved by a SAR ADC comprising: a first stage ADC configured for determining a number of most significant bits of a digital signal corresponding to an analog input signal and for outputting a residue signal corresponding to a number of least significant bits of the digital signal; a gain module configured for receiving the residue signal output from the first stage ADC, for amplifying the residue signal and for outputting the amplified residue signal; a second stage ADC configured for receiving the amplified residue signal and for determining a number of least significant bits of the digital signal corresponding to the input analog signal from the amplified residue signal; and a control module configured for controlling the first stage ADC, the gain module, and the second stage ADC; for outputting the digital output signal corresponding to the input analog signal; storing at least one trigger code; detecting if a binary code determined from the analog input signal matches the at least one trigger code; providing at least one setting code corresponding to the at least one trigger code to the first stage ADC that is further configured for determining a calibration residue signal, and, to the second stage ADC that is further configured for determining a calibration bit; analyzing a least significant bit of the digital signal and the calibration bit; determining, from the analysis, an indication of a presence of gain error in the gain module; and initiating calibrating gain error in the gain module if the presence of gain error is determined.

Such SAR ADC has similar advantages as the method already discussed above.

In an embodiment, the first stage ADC comprises a residue generation module that is configured for determining the calibration residue signal by calculating a difference between the analog input signal and an analog signal representing a part of the at least one setting code.

In an embodiment, the second stage ADC comprises a comparator configured for determining the calibration bit by comparing an amplified calibration residue signal to a further analog signal representing a part of the at least one setting code.

In an embodiment, the gain module comprises: a first amplifier, a second amplifier, a first switch between the first amplifier and the second amplifier, and a second switch after the second amplifier, the control module controlling the first switch and the second switch to store temporarily the calibration residue signal on a capacitor after the first switch until the second stage ADC has determined the least significant bit.

In an embodiment, the control module further comprises a difference calculation module configured for determining if the least significant bit and the calibration bit are different indicating the presence of gain error in the gain module. In one aspect, the control module comprises a gain calibration module configured for determining the value of the least significant bit, and, if it has a value of '1', indicating a downwards calibration, and, if it has a value of '0', indicating an upwards calibration.

In an alternative embodiment, the control module comprises a gain calibration module configured for determining the value of the least significant bit and of the calibration bit, and, if the value of both the least significant bit and the calibration bit is '0', not indicating the presence of gain error in the gain module, and, if the value of both the least significant bit and the calibration bit is '1', not indicating the presence of gain error in the gain module, and if the value of the least significant bit is '0' and the value of the calibration bit is '1', indicating the presence of gain error in the gain module with an upwards calibration, and if the value of the least significant bit is '1' and the value of the calibration bit is '0', indicating the presence of gain error in the gain module with a downwards calibration.

In an embodiment, the control module is further configured to send a signal indicating the presence of gain error in the gain module to the second stage ADC that comprises a plurality of tunable configured to be adjusted in accordance with the signal.

BRIEF DESCRIPTION OF THE DRAWINGS

The disclosure will be further explained by means of the following description and the appended figures.

DETAILED DESCRIPTION OF CERTAIN ILLUSTRATIVE EMBODIMENTS

Figure 1:
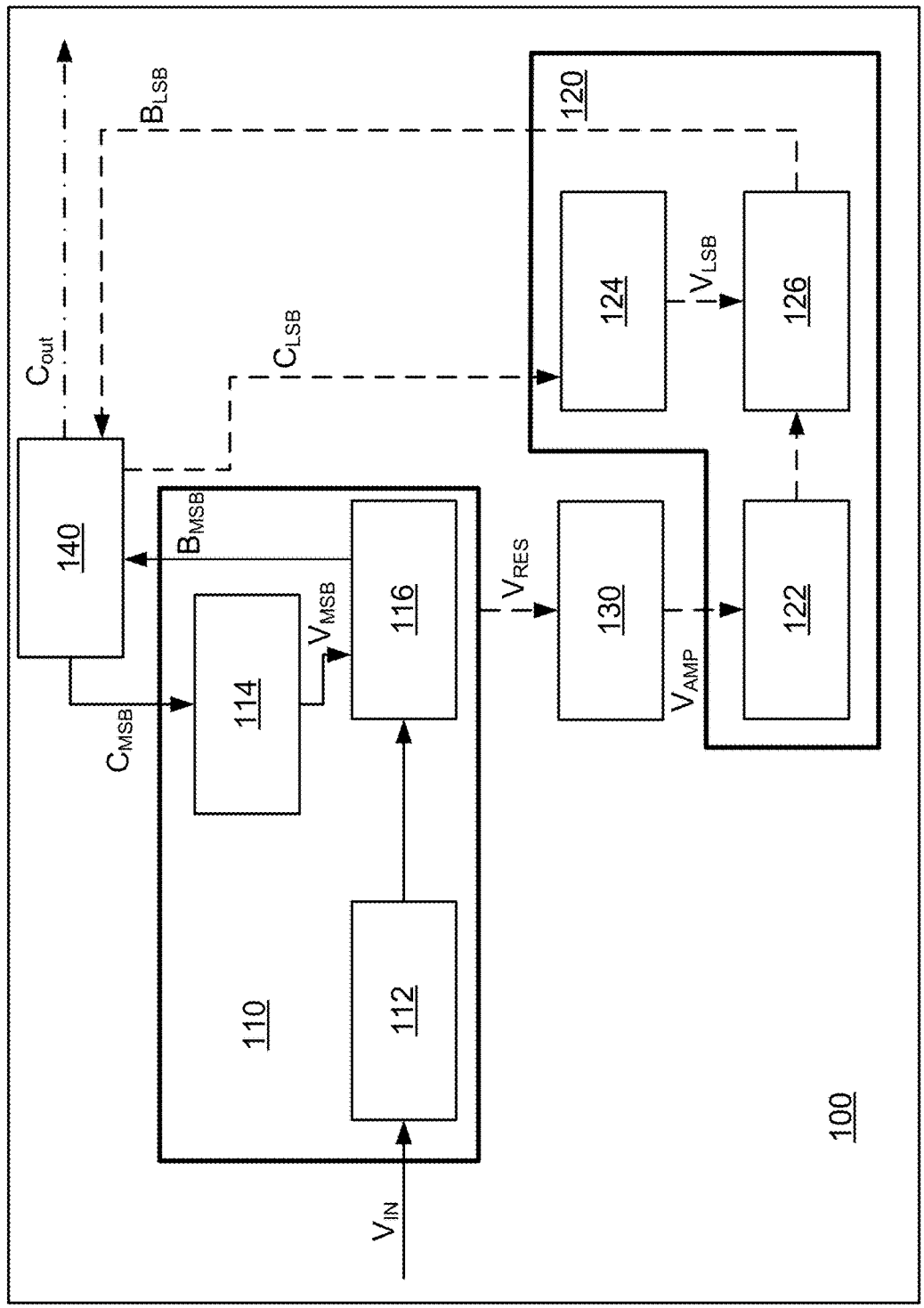
FIG. 1 shows a block diagram of a conventional two-stage pipelined successive approximation register (SAR) analog-to-digital converter (ADC).

The disclosed technology will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

FIG. 1 shows a block diagram of a conventional two-stage pipelined Successive Approximation Register (SAR) analog-to-digital converter (ADC) 100. The two-stage pipelined SAR ADC 100 comprises a first SAR ADC 110, a second SAR ADC 120, a gain module 130 which amplifies an output signal of the first SAR ADC 110, and a control module 140 that controls the two-stage pipelined SAR ADC 100. In FIG. 1, full lines are used to indicate signals being sent until the first SAR ADC 110 has finished its operations, dashed lines are used to indicate signals being sent after the first SAR ADC 110 has finished its operations until the second SAR ADC 120 has finished its operations, and dashed-dotted lines are used to indicate signals being sent after the second SAR ADC 120 has finished its operations.

During operation, an analog input signal $V_{IN}$ is input into the first SAR ADC 110 which determines a number of Most Significant Bits (MSBs). The MSBs are determined by feeding the analog input signal $V_{IN}$ into a first Track-and-Hold module 112 which samples the input signal $V_{IN}$. The control module 140 inputs a digital code $C_{MSB}$ into a first digital-to-analog converter (DAC) 114 which converts the digital code $C_{MSB}$ into a corresponding analog signal $V_{MSB}$. A first comparator 116 compares the input signal $V_{IN}$ with the analog signal $V_{MSB}$ to determine which of the two signals is the greater. Depending on the comparison result, the first comparator 116 will output a binary value $B_{MSB}$.

When the binary value $B_{MSB}$ is 1, the input signal $V_{IN}$ is greater than the analog signal $V_{MSB}$. Similarly, when the binary value $B_{MSB}$ is '0', the input signal $V_{IN}$ is smaller than the analog signal $V_{MSB}$. Using a binary-search algorithm, the control module 140 changes the digital code $C_{MSB}$ until the MSBs of a digital signal corresponding to the input signal $V_{IN}$ are determined.

It will readily be understood that at least one clock signal (not shown in FIG. 1) is provided to control the timing of the two-stage pipelined SAR ADC 100 to provide iterations for the determination of the MSBs and the LSBs of a digital signal corresponding to the analog input signal $V_{IN}$.

For example, in an embodiment, the control module 140 initializes the digital code $C_{MSB}$ as 1000. Depending on the binary value $B_{MSB}$, in the next iteration, the control module 140 sets the digital code $C_{MSB}$ as either 1100, if the binary value $B_{MSB}$ is 1, or 0100, if the binary value $B_{MSB}$ is '0'. In this embodiment, four iterations are performed to determine the four MSBs corresponding to the input signal $V_{IN}$.

It is clear for a skilled person that any number of MSBs can be determined by the first SAR ADC 110 by using a pre-set number of iterations.

After the MSBs have been determined by the first SAR ADC 110, i.e., after the pre-set number of iterations have been performed, the first SAR ADC 110 outputs an analog residue signal $V_{RES}$ that represents the difference between the input signal $V_{IN}$ and the analog signal $V_{MSB}$ that corresponds to the digital code $C_{MSB}$. This analog signal $V_{RES}$ comprises information on the Least Significant Bits (LSBs) of the input signal $V_{IN}$. The signal $V_{RES}$ is sent through the gain module 130 to amplify the signal.

During operation, the amplified signal $V_{AMP}$ from the gain module 130 is input into the second SAR ADC 120 which determines a number of LSBs. Specifically, the LSBs are determined by feeding the amplified signal $V_{AMP}$ into a second Track-and-Hold module 122 which samples the amplified signal $V_{AMP}$. The control module 140 inputs a digital code $C_{LSB}$ into a second DAC 124 which converts the digital code $C_{LSB}$ into a corresponding analog signal $V_{LSB}$. A second comparator 126 compares the amplified signal $V_{AMP}$ with the analog signal $V_{LSB}$ to determine which of the two signals is the greater. Depending on the comparison result, the second comparator 126 will output a binary value $B_{LSB}$.

When the binary value $B_{LSB}$ is '1', the amplified signal $V_{AMP}$ is larger than the analog signal $V_{LSB}$. Similarly, when the binary value $B_{LSB}$ is '0', the input signal $V_{AMP}$ is smaller than the analog signal $V_{LSB}$. Using a binary-search algorithm, the control module 140 changes the digital code $C_{LSB}$ until the LSBs of the digital signal corresponding to the input signal $V_{IN}$ are determined.

After the second SAR ADC 120 has finished its pre-set number of iterations, the control module 140 outputs the digital code $C_{OUT}$ that corresponds to the input signal $V_{IN}$. $C_{OUT}$ is determined by the control module by combining the information on the MSBs determined by the first SAR ADC 110 and the information on the LSBs determined by the second SAR ADC 120.

Figure 2A:
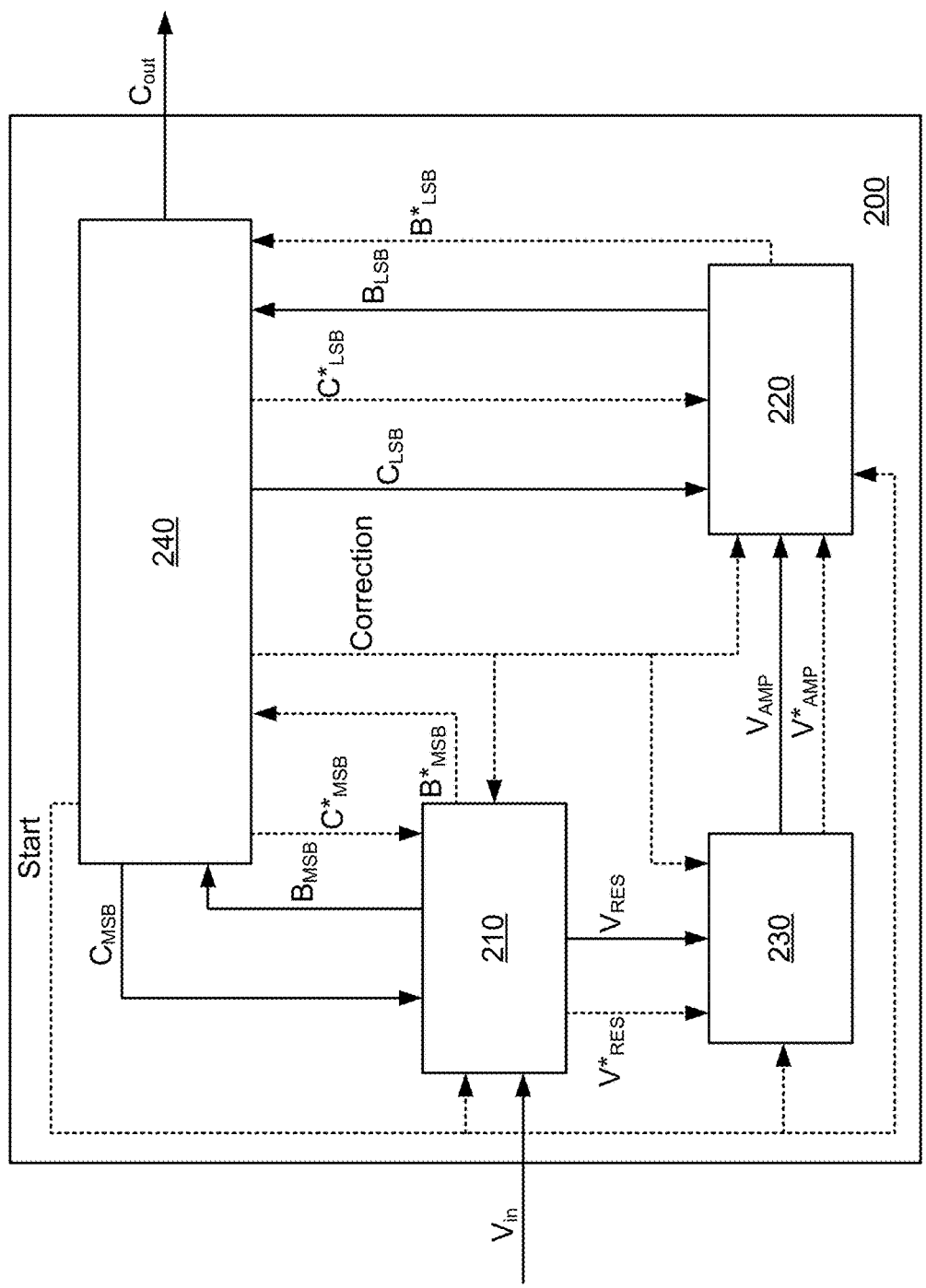
FIG. 2A shows a block diagram of a two-stage pipelined SAR ADC according to the disclosed technology.

FIG. 2A shows a block diagram of a two-stage pipelined SAR ADC 200 with a background calibration to correct: a DAC mismatch error between the SAR ADCs 210, 220; an amplifier gain error due to process, voltage and temperature (PVT) variations in the gain module 230; and offset errors of the comparators 216, 226.

In FIG. 2A, full lines are used to indicate signals that occur during normal operation of the two-stage pipelined SAR ADC 200, while dotted lines are used to indicate signals being sent which are related to extra steps that have to be or have been performed for the background calibration.

The normal operation of the two-stage pipelined SAR ADC 200 is the same as a conventional two-stage pipelined SAR ADC 100 as shown in FIG. 1. Specifically, an input signal $V_{IN}$ is input into the first SAR ADC 210 which iteratively determines a number of MSBs as described above. The first SAR ADC 210 outputs the residue signal $V_{RES} = V_{IN} - V_{MSB}$ which is then amplified in the gain module 230, and, the amplified signal $V_{AMP}$ is input to the second SAR ADC 220. The second SAR ADC 220 determines the LSBs of the input signal $V_{IN}$ based on the amplified signal $V_{AMP}$. Both the MSBs and the LSBs are stored in the control module 240 where they are combined and the control module 240 outputs the digital code $C_{OUT}$ that corresponds to the input signal $V_{IN}$.

In an embodiment, the first SAR ADC 210 uses a seven-bit digital code $C_{MSB}$, and, thus performs seven comparisons to determine seven bits of the digital signal corresponding to the input signal $V_{IN}$, while the second SAR ADC 220 uses an eight-bit digital code $C_{LSB}$, and, thus performs eight comparisons. However, due to a redundancy in the two-stage pipelined SAR ADC 200, the second SAR ADC 220 also only determines seven bits of the input signal $V_{IN}$. As such, in this embodiment, a total of fifteen comparisons are performed to determine a fourteen-bit digital signal corresponding to the input signal $V_{IN}$. This creates an inter-stage redundancy as the LSB of the first SAR ADC 210 is directly linked to the MSB of the second SAR ADC 220 by the gain module 230, namely:

$$\text{Gain} * \text{LSB}_{1st} = \text{MSB}_{2nd} \quad (1)$$

Figure 3:
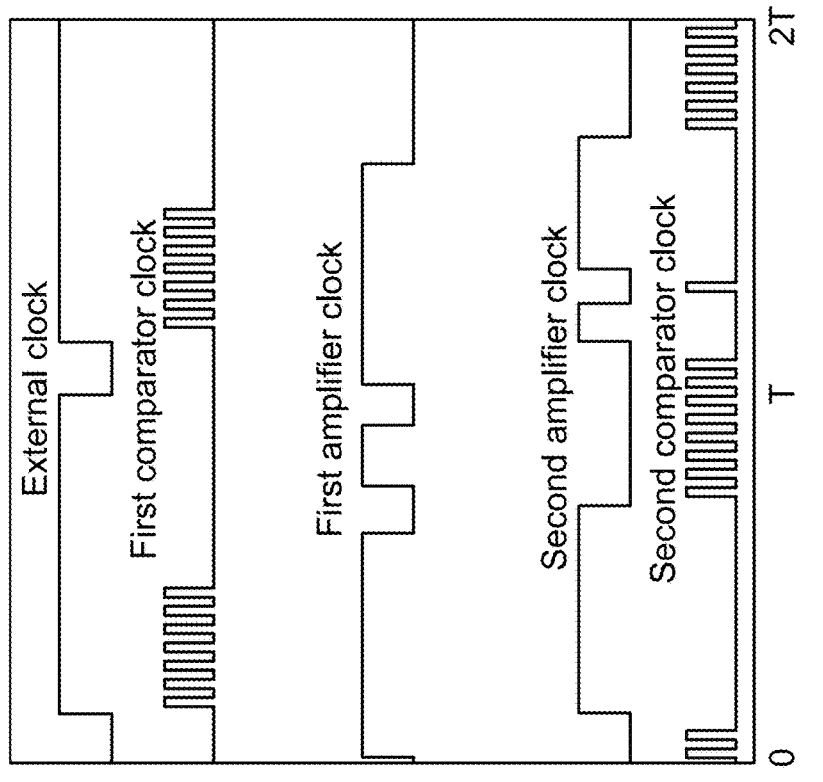
FIG. 3 shows a timing diagram of the two-stage pipelined SAR ADC of FIG. 2A during normal operation.

A timing diagram of this embodiment is shown in FIG. 3 over two cycles of the conversion process. An external clock signal (generated by a timing module (not shown) in the control module 240) initiates the conversion process.

A first comparator clock signal controls operation of the first comparator (not shown in FIG. 2A) in the first SAR ADC 210. It is clear that the first comparator has seven operation cycles. After the first comparator has finished its operations, the gain module 230 is activated.

As will be described below, the gain module 230 comprises a two-stage amplifier. As such, a first amplifier clock signal indicates when the first amplifier of the two-stage amplifier is active (i.e., the period between the transitions from high to low and then from low to high of the first amplifier clock signal).

Similarly, the second amplifier clock signal indicates when the second amplifier of the two-stage amplifier is active (i.e., the period between the transitions from high to low and then from low to high of the second amplifier control (or clock signal)).

A second comparator clock signal controls the operation of the second comparator (not shown in FIG. 2A) in the second SAR ADC 220. It is clear that the second comparator has eight operation cycles concurrently with the second amplifier being active indicated by the second amplifier clock signal.

It will be appreciated that each SAR ADC 210, 220 may also perform another number of comparisons depending on the architecture in which the two-stage pipelined SAR ADC 200 is used. However, it is essential that an inter-stage redundancy is maintained which directly links the LSB of the first SAR ADC 210 is directly linked to the MSB of the second SAR ADC 220.

Returning to FIG. 2A, in the two-stage pipelined SAR ADC 200 of the disclosed technology, the control module 240 performs a detection step after the MSB has been determined by the second SAR ADC 220. Specifically, the control module 240 determines if the binary code containing the MSBs of the first SAR ADC 210 and the MSB of the LSBs of the second SAR ADC 220 matches a pre-set binary code. If this code, which will be referred to hereinafter as $C_{DET}$ (not shown), indeed matches a pre-set binary code, a calibration process is triggered as will be described below. If, on the other hand, this code does not match a pre-set binary code, no calibration process is triggered and the standard operation of the two-stage pipelined SAR ADC 200 continues either until the entire analog input signal $V_{IN}$ has been converted into a digital signal or until the code $C_{DET}$ matches a pre-set binary code.

Figure 2B:
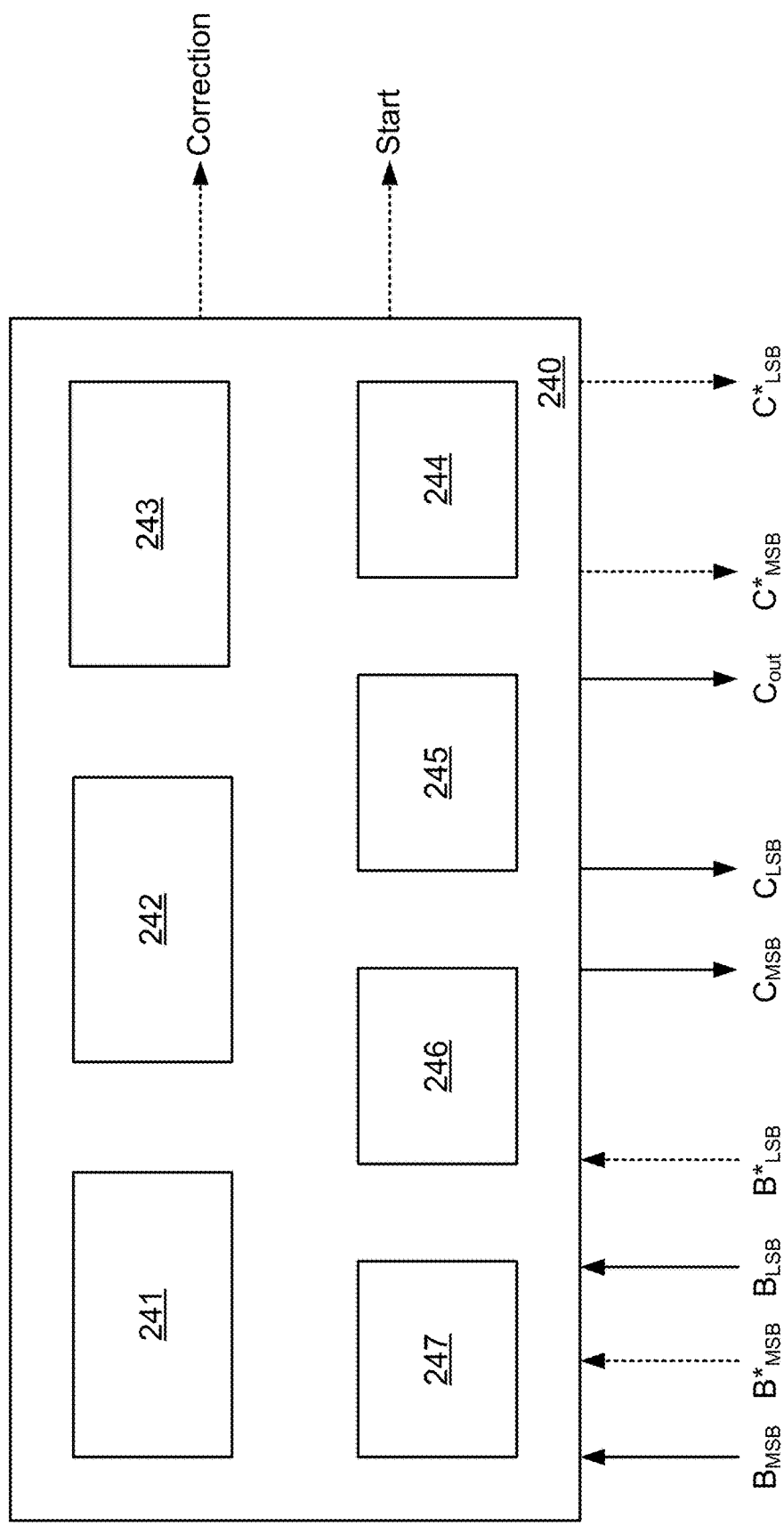
FIG. 2B shows a block diagram of the control module of the two-stage pipelined SAR ADC of FIG. 2A.

FIG. 2B shows a block diagram of the control module 240 of the two-stage pipelined SAR ADC 200 of FIG. 2A. The control module 240 comprises an interface module 241 that is used for receiving the various input signals and for transmitting various output signals to other modules of the two-stage pipelined SAR ADC 200.

The control module 240 further comprises a memory module 242 that can store the binary codes that are detected by each SAR ADC 210, 220 during the successive approximation of the input signal $V_{IN}$. Moreover, the memory module 242 may also store suitable pre-set binary codes that trigger a calibration process as described below.

The control module 240 also comprises a detection module 243 that detects whether the code $C_{DET}$ matches a pre-set binary code that is stored in the memory module 242. If a pre-set binary code is detected, this detection is communicated to the relevant calibration module, i.e., one of the DAC mismatch calibration module 244, the amplifier gain calibration module 245, and the offset calibration module 246.

Moreover, the control module 240 comprises a difference calculation module 247 which determines a difference between two bit values. The difference calculation module 247 is used in the calibration as described below.

It is clear for a skilled person that the control module 240 further comprises suitable internal connections (not shown) between the different modules in order to transmit signals to and/or receive signals from other modules.

Figure 2C:
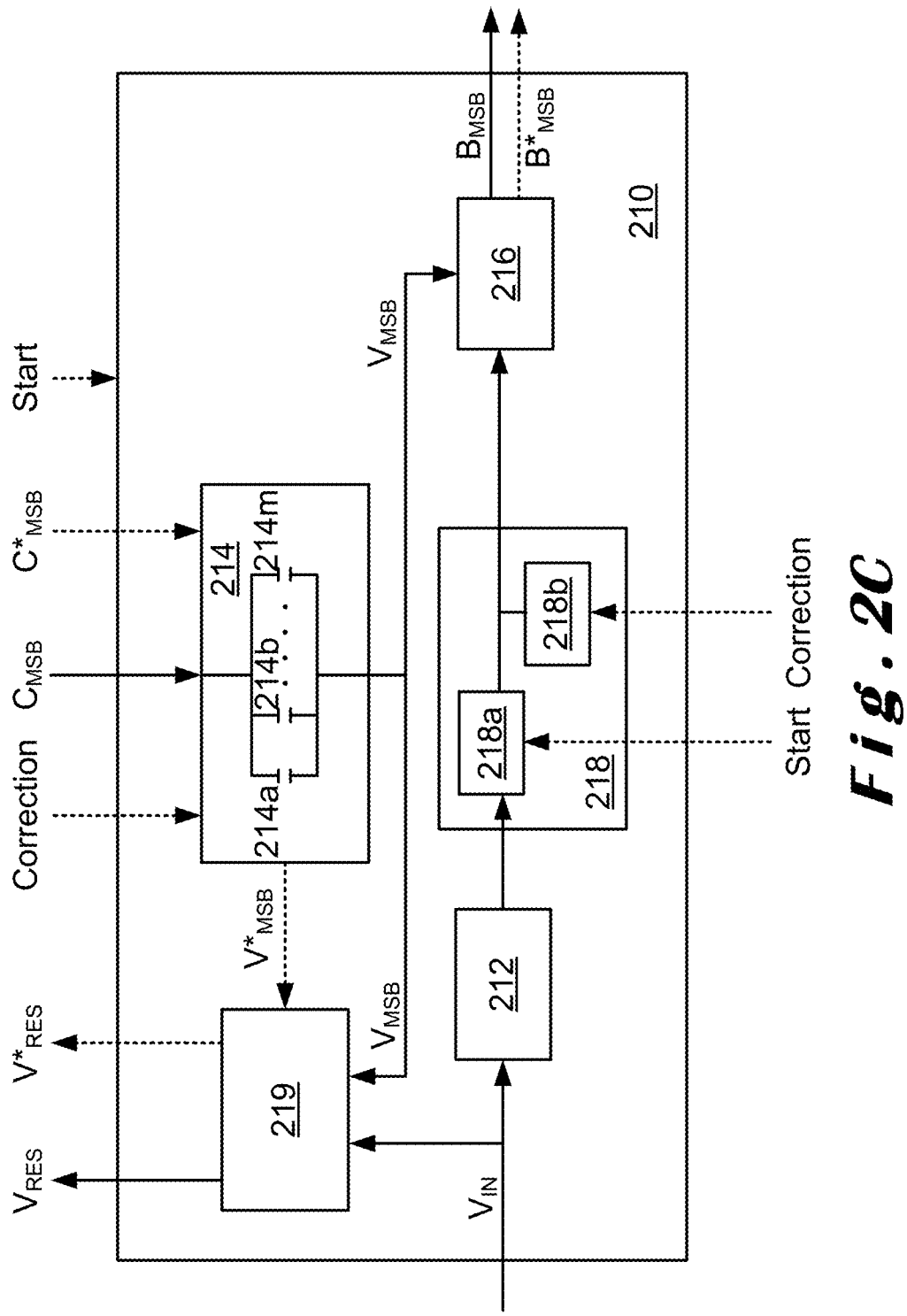
FIG. 2C shows a block diagram of the first SAR ADC of the two-stage pipelined SAR ADC of FIG. 2A.

FIG. 2C shows a block diagram of the first SAR ADC 210 of the two-stage pipelined SAR ADC 200 of the disclosed technology. As in the conventional SAR ADC 110 shown in FIG. 1, the first SAR ADC 210 is used to determine m MSBs of the analog input signal $V_{IN}$ and comprises a Track-and-Hold module 212, a first DAC 214, and a first comparator 216. The Track-and-Hold module 212 samples the input signal $V_{IN}$ and feeds it, via a first comparator offset correction module 218 (the operation of which is described below) to the first comparator 216.

The first DAC 214 comprises m capacitors 214a, 214b, ..., 214m, each capacitor being associated with a bit of the m MSBs to be determined. Depending on the digital code $C_{MSB}$ that is received in the first DAC 214, one or more of the capacitors 214a, 214b, ..., 214m will be switched on to convert the digital code $C_{MSB}$ into an analog signal $V_{MSB}$.

During normal operation, the first comparator 216 outputs a binary value $B_{MSB}$ based on the comparison of $V_{IN}$ and $V_{MSB}$. After the MSBs have been determined, a residue generation module 219 in the first SAR ADC 210 generates the residue signal $V_{RES}=V_{IN}-V_{MSB}$ which is then output from the first SAR ADC 210.

As described above with respect to FIG. 2A, when the detection module 243 detects that the code $C_{DET}$ matches a pre-set binary code associated with a DAC mismatch calibration, the detection module 243 sends a signal to the DAC mismatch calibration module 244 that a calibration will occur. The DAC mismatch calibration module 244 then sends a specific digital calibration code $C^*_{MSB}$ to the first DAC 214, thus generating the analog calibration signal $V^*_{MSB}$.

As the code $C_{DET}$ is only determined after the first SAR ADC 210 has finished determining the MSBs, the signal $V_{RES}$ has already been output from the first SAR ADC 210. However, when a DAC mismatch calibration is triggered, the DAC mismatch calibration module 244 will trigger an additional step in the first SAR ADC 210. This additional step calculates a calibration residue signal, namely $V_{RES}^*=V_{IN}-V_{MSB}^*$, which is the difference between the input signal $V_{IN}$ with the analog calibration signal $V^*_{MSB}$. The output of this calculation is shown as a dotted line in FIG. 2C to indicate that this is an additional operation which does not occur during normal operation. After the output of the calibration residue signal $V^*_{RES}$, the first SAR ADC 210 starts sampling the input signal $V_{IN}$ again, thus starting the next cycle of normal operation.

Figure 4:
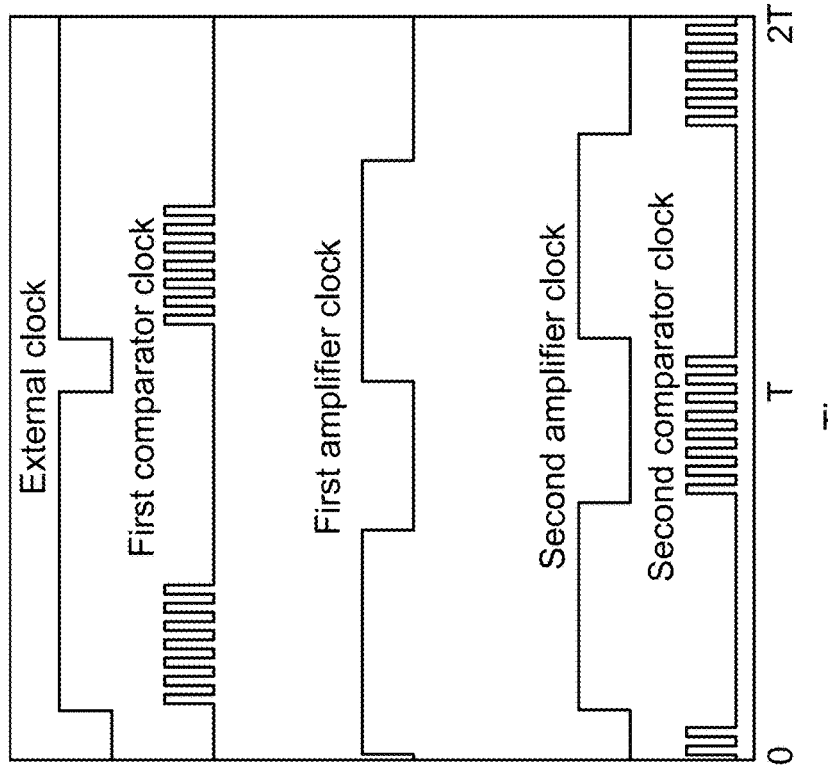
FIG. 4 shows a timing diagram of the two-stage pipelined SAR ADC of FIG. 2A during a DAC mismatch calibration, an amplifier gain calibration, or an offset calibration of the second comparator.

A timing diagram of the two-stage pipelined SAR ADC during a DAC mismatch calibration is shown in FIG. 4. As shown in FIG. 3, the external clock signal generated by the control module, the first comparator clock signal controls operation of the first comparator 216 in the first SAR ADC 210, the first amplifier clock signal indicates when the first amplifier of the two-stage amplifier is active, the second amplifier clock signal indicates when the second amplifier of the two-stage amplifier is active, and the second comparator clock signal controls the operation of the second comparator in the second SAR ADC 220.

From FIG. 4, it is clear that during a DAC mismatch calibration, the first and the second amplifier clock signals are changed. Specifically, the first amplifier is reset after the code $C_{DET}$ has been determined, i.e., after the MSB of the LSBs of the second SAR ADC 220 has been determined.

Figure 2D:
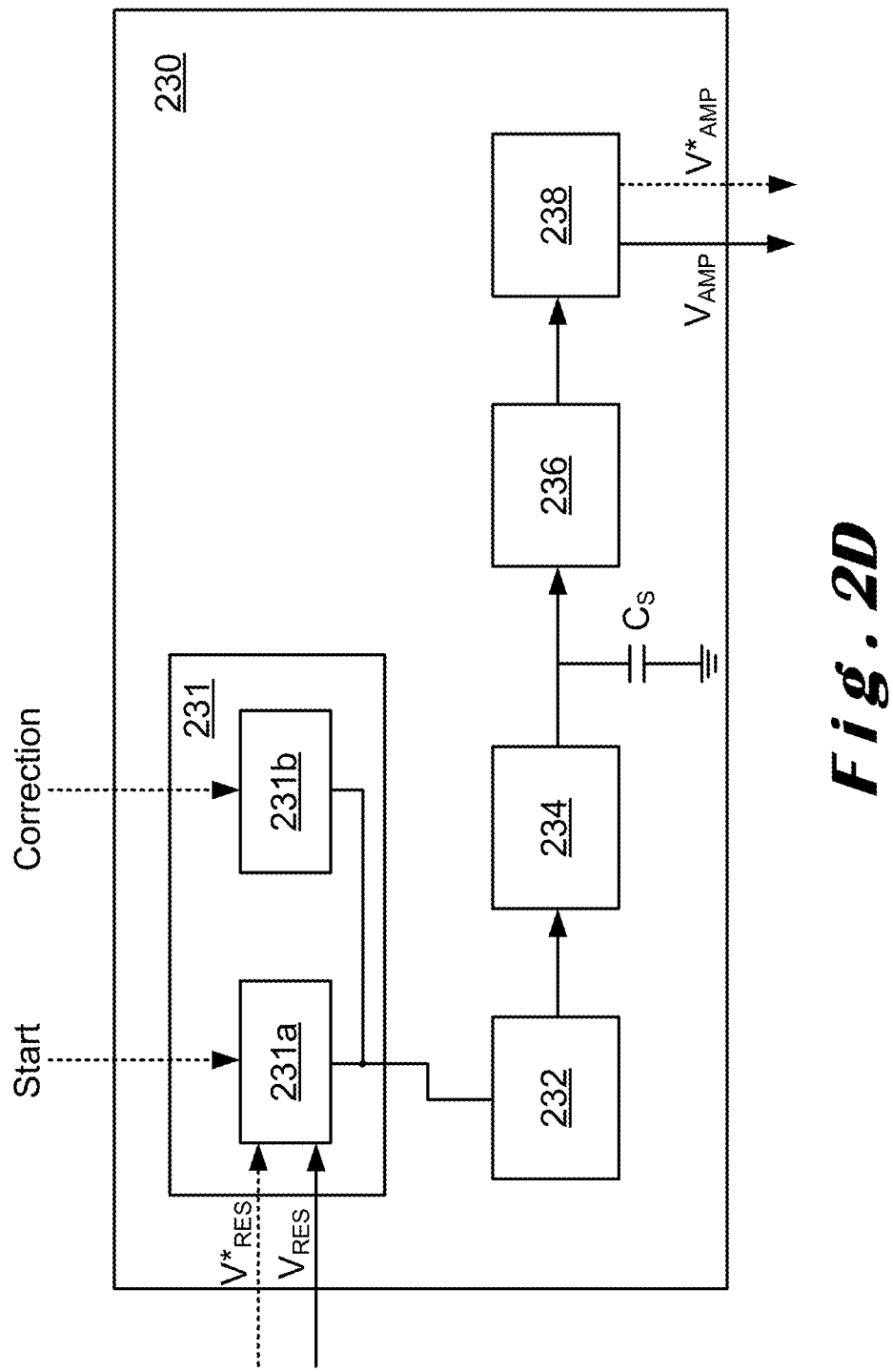
FIG. 2D shows a block diagram of the gain module of the two-stage pipelined SAR ADC of FIG. 2A.

FIG. 2D shows a block diagram of the gain module 230 of the two-stage pipelined SAR ADC 200 of the disclosed technology. As described above, the gain module 230 is in the form of a two-stage amplifier and comprises a first amplifier 232 and a second amplifier 236. Between the amplifiers 232, 236 is a first switch 234 that can open/close the circuit. A capacitor $C_S$ is located after the first switch 234 so that, when it is closed, an analog signal can be stored thereon.

After the second amplifier 232, the gain module 230 comprises a second switch 238 that can open/close the circuit. When the second switch 238 is closed, the amplified signal $V_{AMP}$ is output from the gain module 230. The gain module 230 also comprises an offset correction module 231 the operation of which is described below.

From FIG. 3, it is clear that, during normal operation, first and second switches 234 and 236 can be closed in accordance with respective ones of the first and second amplifier clock signals such that the signal $V_{RES}$ can be amplified in the gain module 230 without interruption and $V_{AMP}$ is output to the second SAR ADC 220 that can determine the LSBs.

However, during a DAC mismatch calibration process, the calibration residue signal $V^*_{RES}$ has already been determined before the second SAR ADC 220 has finished determining the LSBs of the input signal $V_{IN}$. Therefore, to ensure that the second SAR ADC 220 can determine the bits of the amplified signal $V_{AMP}$ corresponding to $V_{RES}$, which bits corresponds to the LSBs of the input signal $V_{IN}$, the amplified calibration signal $V^*_{AMP}$ corresponding to the calibration residue signal $V^*_{RES}$ cannot be output from the gain module 230 before the second SAR ADC 220 has finished determining the LSBs. To achieve a latency between receiving the calibration residue signal $V^*_{RES}$ and outputting the amplified calibration signal $V^*_{AMP}$, the two-stage amplifier shown in FIG. 2D is advantageous.

As shown in FIG. 4, after $V_{RES}$ has been determined by the first SAR ADC 210, the first amplifier 232 becomes active and amplifies the signal $V_{RES}$ and immediately puts it through to the second amplifier 236 that generates $V_{AMP}$. As such, both the first and the second switch 234 and 238 are closed. However, when the first SAR ADC 210 is determining the calibration residue signal $V^*_{RES}$, the first switch 234 opens to allow the first amplifier 232 to reset. When the first SAR ADC 210 outputs the calibration residue signal $V^*_{RES}$, the first switch 234 is closed again and the first amplifier 232 amplifies the calibration residue signal $V^*_{RES}$. This intermediate amplified signal is then stored on the storage capacitor $C_S$ and the first switch 234 is closed again. As such, the first SAR ADC 210 can continue its normal sampling operation of the next cycle without influencing the intermediate amplified signal stored on the storage capacitor $C_S$. When the second SAR ADC 220 has finished its last comparison, i.e., after having determined all the LSBs of the input signal $V_{IN}$, the second amplifier 236 is reset by opening the second switch 238. After being reset, the second amplifier 236 amplifies the intermediate amplified signal stored on the storage capacitor $C_S$ and outputs the amplified calibration signal $V^*_{AMP}$ to the second SAR ADC 220. As will be described below, the second SAR ADC 220 then performs an extra comparison.

Figure 2E:
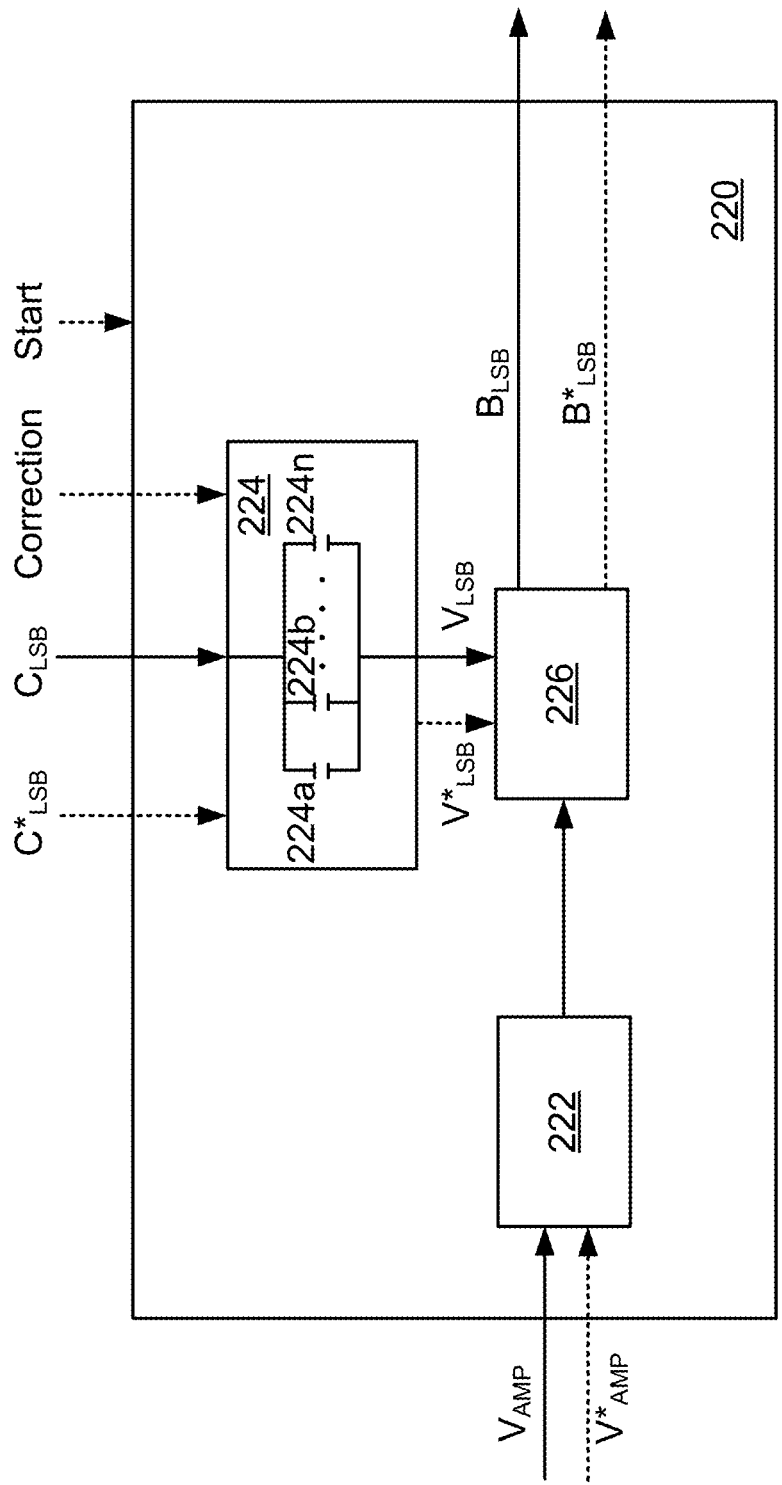
FIG. 2E shows a block diagram of the second SAR ADC of the two-stage pipelined SAR ADC of FIG. 2A.

FIG. 2E shows a block diagram of the second SAR ADC 220 of the two-stage pipelined SAR ADC 200 of the disclosed technology. As in the conventional SAR ADC 120 shown in FIG. 1, the second SAR ADC 220 is used to determine n LSBs of the analog input signal $V_{IN}$ and comprises a Track-and-Hold module 222, a second DAC 224, and a second comparator 226.

The Track-and-Hold module 222 samples the input signal $V_{AMP}$ and feeds it to the second comparator 226. The second DAC 224 comprises n capacitors 224a, 224b, ..., 224n, each capacitor being associated with a bit of the n LSBs to be determined. Depending on the digital code $C_{LSB}$ that is received in the second DAC 224, one or more of the capacitors 224a, 224b, ..., 224n will be switched on to convert the digital code $C_{LSB}$ into an analog signal $V_{LSB}$. During normal operation, the second comparator 226 outputs a binary value $B_{LSB}$ based on the comparison of $V_{AMP}$ and $V_{LSB}$.

As described above, when the detection module 243 detects that the code $C_{DET}$ matches a pre-set binary code associated with a DAC mismatch calibration, the detection module 243 sends a signal to the DAC mismatch calibration module 244 that a calibration will occur as indicated by the dotted line in FIG. 2A with the 'start' signal.

As described above, the first SAR ADC 210 outputs calibration residue signal $V^*_{RES}$ which is amplified by the gain module 230 to amplified calibration signal $V^*_{AMP}$ that is input in the second SAR ADC 220 after it has finished determining the LSBs of the digital signal corresponding to the input signal $V_{IN}$. The DAC mismatch calibration module 244 then sends a specific digital calibration code $C^*_{LSB}$ to the second DAC 224, thus generating the analog calibration signal $V^*_{LSB}$. Moreover, an additional compare cycle will be triggered in the second SAR ADC 220. This additional cycle then compares the input signal, i.e., the amplified residue signal $V^*_{AMP}$, with the analog calibration signal $V^*_{LSB}$. The output of this comparison is the calibration bit indicated with $B^*_{LSB}$ and is sent to the control module 240.

The difference calculation module 247 then calculates the difference between the last bit of $C_{OUT}$ and the calibration bit $B^*_{LSB}$. Depending on the result of this comparison, the capacitance value(s) of the capacitors 214a, 214b, ..., 214m in the first DAC 214 is modified to counter the capacitor mismatch between the first DAC in the first SAR ADC 210 and the second DAC in the second SAR ADC 220.

The advantage of this type of calibration is that it can be performed in the background, i.e., the normal operation of the two-stage pipelined SAR ADC 200 is not interrupted. There is only one additional comparison cycle in the second SAR DAC 220, but, as shown on the timing diagrams in FIGS. 3 and 4, the total timing of the two-stage pipelined SAR ADC 200 is not significantly affected.

The DAC mismatch calibration is based on choosing the correct pre-set binary code $C_{DET}$. As already described above, the residue signal of the first SAR ADC 210 is given by $V_{RES} = V_{IN} - V_{MSB}$ and $V_{RES}^* = V_{IN} - V_{MSB}^*$.

Moreover, similar equations apply to the residue signal of the second SAR ADC 220: $V_{RES2} = \text{Gain} \cdot V_{RES} - V_{LSB}$ and $V_{RES2} = \text{Gain} \cdot V_{RES}^* - V_{LSB}^*$. Combining these equations shows that:

$$V_{RES2}^* - V_{RES} = \text{Gain} \cdot (V_{MSB} - V_{MSB}^*) - (V_{LSB}^* - V_{LSB}) \quad (2)$$

When assuming that the amplifier gain is ideal, i.e., by assuming that Equation (1) is valid, this leads to:

$$V_{RES2}^* - V_{RES} = \frac{MSB_{2nd}}{LSB_{1st}} \cdot (V_{MSB} - V_{MSB}^*) - (V_{LSB}^* - V_{LSB}) \quad (3)$$

Depending on the value of the pre-set code $C_{DET}$ and the value to which the binary calibration codes $C^*_{MSB}$ and $C^*_{LSB}$ are set in response, the signs of Equation (3) are known.

In an embodiment, in calibrating the first capacitor 214a in the first DAC to better match with the first capacitor 224a in the second DAC, the pre-set code $C_{DET}$=1000000 0XXXXXXX, where X indicate binary values that have not been determined yet by the second SAR ADC 220. In this embodiment, the first SAR ADC 210 uses a seven-bit digital code $C_{MSB}$ and thus performs seven comparisons to determine seven bits of the digital signal corresponding to the input signal $V_{IN}$, while the second SAR ADC 220 uses an eight-bit digital code $C_{LSB}$ and thus performs eight comparisons. As described above, due to the inter-stage redundancy the LSB of the first SAR ADC 210 is directly linked to the MSB of the second SAR ADC 220. When this specific code $C_{DET}$ is encountered during the conversion of the input signal $V_{IN}$, the detection module 243 will activate the DAC mismatch calibration module 244 which will input $C*_{MSB}$=0111111 into the first DAC. Based on this calibration code, the calibration residue signal $V*_{RES}$ is generated. After the second SAR ADC 220 has determined the last LSB of the digital code corresponding to the input signal $V_{IN}$, the DAC mismatch calibration module 244 will input the calibration code $C*_{LSB}$=1YYYYYYY into the second DAC, where Y indicates the binary value that was determined by the second SAR ADC 220. Based on these binary codes, ideally, i.e., assuming that the gain error and the offset error are correctly calibrated, $V_{MSB}-V_{MSB}*$=LSB$_{1st}$ and $V_{LSB}*-V_{LSB}$=MSB$_{2nd}$ which indicates that $V_{RES2}*-V_{RES}$=0.

Therefore, the signs of $V_{RES2}$ and $V*_{RES2}$ should be the same, and, it is exactly these signs that are reflected in the last bit of $C_{OUT}$ and $B*_{LSB}$. Therefore, if the difference of these bits is non-zero, there is a DAC calibration mismatch between the first capacitor 214a of the first DAC and the first capacitor 224a of the second DAC.

After the error has been detected, i.e., if the last two bits, i.e., the last bit of $C_{OUT}$ and $B*_{LSB}$, either form '01' or '10', the error needs to be corrected. This correction is done by tuning the capacitance of the first capacitor 214a of the first DAC. Specifically, if the bits form '01', a correction signal is sent to the first capacitor 214a to decrease the capacitance, while, if the bits form '10', a correction signal is sent to the first capacitor 214a to increase the capacitance. This signal is indicated by the dotted line in FIG. 2A termed 'correction'.

In a similar fashion, other pre-set binary codes are used for other capacitors of the first DAC that result in the same capacitance tuning for those specific capacitors. Specifically, $C_{DET}$=0100000 0XXXXXXX and $C*_{DET}$=0011111 1YYYYYYY, where $C*_{DET}$ is a pre-set calibration response code to $C_{DET}$, for the second capacitor 214b of the first DAC; $C_{DET}$=0110000 0XXXXXXX and $C*_{DET}$=0101111 1YYYYYYY for the third capacitor 214c of the first DAC; $C_{DET}$=0111000 0XXXXXXX and $C*_{DET}$=0110111 1YYYYYYY for the fourth capacitor 214d of the first DAC; and $C_{DET}$=0111100 0XXXXXXX and $C*_{DET}$=0111011 1YYYYYYY for the fifth capacitor 214e of the first DAC, etc. where X indicates binary values that have not been determined yet by the second SAR ADC 220 and where Y indicates the binary value that was determined by the second SAR ADC 220.

It will be understood that these pre-set codes can be generalized for other number of bits that are determined in the respective SAR ADCs.

The two-stage pipelined SAR ADC 200 of the disclosed technology can also be used to correct changes in the amplifier gain due to PVT variations. The main difference between the amplifier gain calibration and the DAC mismatch calibration described above are the pre-set binary codes $C_{DET}$ and $C*_{DET}$ and that the correction is now performed in the second DAC in the second SAR ADC module 220. Specifically, when assuming that there is no capacitor mismatch between the first and the second DAC, Equation (2) becomes:

$$V_{RES2}*-V_{RES}=MSB_{2nd}-Gain*LSB_{1st} \quad (4)$$

which would equal 0 if the gain is calibrated correctly. However, if the gain is not calibrated correctly, the sign of Equation (4) indicates the direction of the gain error. As before, the signs of $V_{RES2}$ and $V*_{RES2}$ are reflected in the last bit of $C_{OUT}$ and $B*_{LSB}$, and, if the difference of these bits is non-zero, there is a gain calibration error.

For the gain calibration, the pre-set codes are taken as, $C_{DET}$=1001000 1XXXXXXX and $C*_{DET}$=1001001 0YYYYYYY where X indicate binary values that have not been determined yet by the second SAR ADC 220 and where Y indicates the binary value that was determined by the second SAR ADC 220. For these codes, it would be expected that, if there is no gain error, they would result in the same analog values. However, other pre-set codes are possible, for example, $C_{DET}$=ZZZZZ01 1XXXXXXX and $C*_{DET}$=ZZZZZ10 0YYYYYYY where X indicate binary values that have not been determined yet by the second SAR ADC 220, where Y indicates the binary value that was determined by the second SAR ADC 220, and where Z indicates an unspecified binary value. The only other limitation in the choice of $C_{DET}$ and $C*_{DET}$ is that they should not coincide with pre-set binary codes that would trigger the DAC mismatch calibration.

Therefore, when a pre-set gain calibration code is detected, the detection module 243 will activate the amplifier gain calibration module 245. This module will then determine the calibration code $C*_{DET}$ that corresponds to the detected code $C_{DET}$ and will send the calibration code $C*_{DET}$ to the interface module 241 which send it to each of the first and the second DAC together with the 'start' signal to the first SAR ADC 210, the second SAR ADC 220, and the gain module 230.

In a similar manner as in the DAC mismatch calibration, the calibration bit $B*_{LSB}$ will be output from the second SAR ADC 220 and sent to the control module 240. The difference calculation module 247 then calculates the difference and detects if there is an error. After the error has been detected, i.e., if the last two bits, i.e., the last bit of $C_{OUT}$ and $B*_{LSB}$, either form '01' or '10', the error needs to be corrected. This correction is done by tuning the capacitance value(s) of the capacitors 224a, 224b, . . . , 224n of the second DAC 224. Specifically, if the bits form '01' a correction signal is sent to increase the capacitance, while if the bits form '10' a correction signal is sent to decrease the capacitance. This signal is indicated by the dotted line in FIG. 2A termed 'correction'.

The two-stage pipelined SAR ADC 200 of the disclosed technology can also be used to correct errors due to offsets in at least one of the first comparator 216, the gain module 230, and the second comparator 226. If the offsets for the first comparator 216, the gain module 230, and the second comparator 226 are represented by $V_1$, $V_2$, and $V_3$ respectively, the offset on the final residue $V_{RES2}$ is $$V_1+V_2-V_3/Gain$$

where Gain indicates the amplifier gain. If this offset value is greater than the redundancy, it is to be expected that the two-stage pipelined SAR ADC 200 could output wrong digital codes. As such, the residue of the second SAR ADC 220 is $V_{RES2}$=Gain*$(V_{IN}+V_2)-V_{LSB}-V_3$.

In an embodiment of the disclosed technology, the cumulated offset error due to the gain module 230 and the second comparator 226 is corrected simultaneously, and, in a similar manner to the DAC mismatch calibration and the gain calibration. For this offset calibration, the pre-set codes can take any binary value, but it may be advantageous that a pre-set binary code is selected that does not coincide with any of the pre-set codes used for either the DAC mismatch calibration or the gain error calibration.

If a pre-set offset calibration code $C_{DET}$ is detected, the detection module 243 will send a signal to the offset calibration module 246, and, the offset calibration module will send a corresponding calibration code $C^*_{DET}$ to the interface 241. The interface 241 will then send this code corresponding code together with the 'start' signal to the first SAR ADC 210, the second SAR ADC 220, and the gain module 230.

In offset calibration, besides changing the DAC codes from $C_{MSB}$ and $C_{LSB}$ to $C^*_{MSB}$ and $C^*_{LSB}$ respectively, a signal is also sent to the offset correction module 231 in the gain module 230. Specifically, this signal is sent to crossing module 231a in offset correction module 231 (as shown FIG. 2D). When receiving this signal, the crossing module 231a switches the inputs.

In an embodiment, the two-stage pipelined SAR ADC 200 is implemented as a differential circuit. In this embodiment, the crossing module 231a simply crosses the positive signal and the negative signal that enter the offset correction module 231.

In an alternative embodiment, the two-stage pipelined SAR ADC 200 is implemented as a non-differential circuit. In this embodiment, the crossing module 231a crosses the incoming signal that enters the offset correction module 231 with a reference signal provided to the offset correction module.

Next to crossing the incoming signal(s), the first and the second DACs are also inverted. In other words, the calibration code $C^*_{DET}$ is the logical inverse of $C_{DET}$. As such, the residue of the second SAR DAC 220 is $V_{RES2}^* = \text{Gain}^*(-V_{IN}+V_2)-V_{LSB}^*-V_3$. This leads to $$V_{RES2}^* + V_{RES} = 2 * \text{Gain} * (V_2 - V_3/\text{Gain}) \quad (5)$$

In a similar manner as in the DAC mismatch calibration, the calibration bit $B^*_{LSB}$ will be output from the second SAR ADC 220 and sent to the control module 240. The difference calculation module 247 then calculates the difference which corresponds to the sign of Equation (5) and detects if there is an error. After the error has been detected, i.e., if the last two bits, i.e., the last bit of $C_{OUT}$ and $B^*_{LSB}$, either form '00' or '11', the error needs to be corrected. This correction is done by tuning a second variable capacitance module 231b in the offset correction module 231 in the gain module 230 as shown in FIG. 2D (the term "second" referring to the second part of the circuit, namely, the gain module 230 in this case). Specifically, if the bits form '00' a correction signal is sent to increase the capacitance, while if the bits form 11 a correction signal is sent to decrease the capacitance. This signal is indicated by the dotted line in FIG. 2A termed 'correction'.

The reason that the error is now detected due to the two bits, i.e., the last bit of $C_{OUT}$ and $B^*_{LSB}$, being the same is due to the fact that, by crossing the signal, if there would be no offset error in either the gain module 230 or the second comparator 226, both bits would be opposite to one another. Therefore, if this is not the case, i.e., if both bits are equal, there is an offset error in at least one of the gain module 230 and the second comparator 226.

Because the correction signal is sent to the variable capacitance module 231b that is located before the first amplifier 234 and the second amplifier 238 and before the second comparator 226 of the second ADC stage 220, the same signal can be used to correct all of these possible sources of offset signals simultaneously.

As described above, the offset error of the first comparator 216 can also be calibrated. In principle, the same technique is used as for calibrating the offset in the gain module 230 and the second comparator 226, but the timing of the two-stage pipelined SAR ADC 200 in accordance with the disclosed technology is different with respect to the calibration processes described above.

As shown in FIG. 2C, the first SAR ADC 210 comprises a first comparator offset correction module 218 comprising a crossing module 218a and a first variable capacitance module 218b (the term "first" referring to the first part of the circuit, namely, the first SAR ADC 210 in this case).

As for the calibrating the offset in the gain module 230 and the second comparator 226, the crossing module 218 switches the incoming signals when a calibration is triggered. This can again be the positive signal and negative signal if the two-stage pipelined SAR ADC 200 is a differential circuit or the incoming signal and a reference for a non-differential circuit. As before, there is also no requirement for the pre-set binary code $C_{DET}$, but it is recommended to assign a pre-set binary code that does not coincide with any of the pre-set codes for the other calibration methods. Upon crossing the signal, the first DAC 214 is also inverted, i.e., the calibration code $C^*_{DET}$ is the binary inverse of the code $C_{DET}$.

In this calibration, no calibration residue signal $V^*_{RES}$ is generated, there is only one additional comparison cycle in the first SAR ADC 210. As such, there is also no need for the complex timing in the gain module 230 that was described above with respect to other calibration methods.

Figure 5:
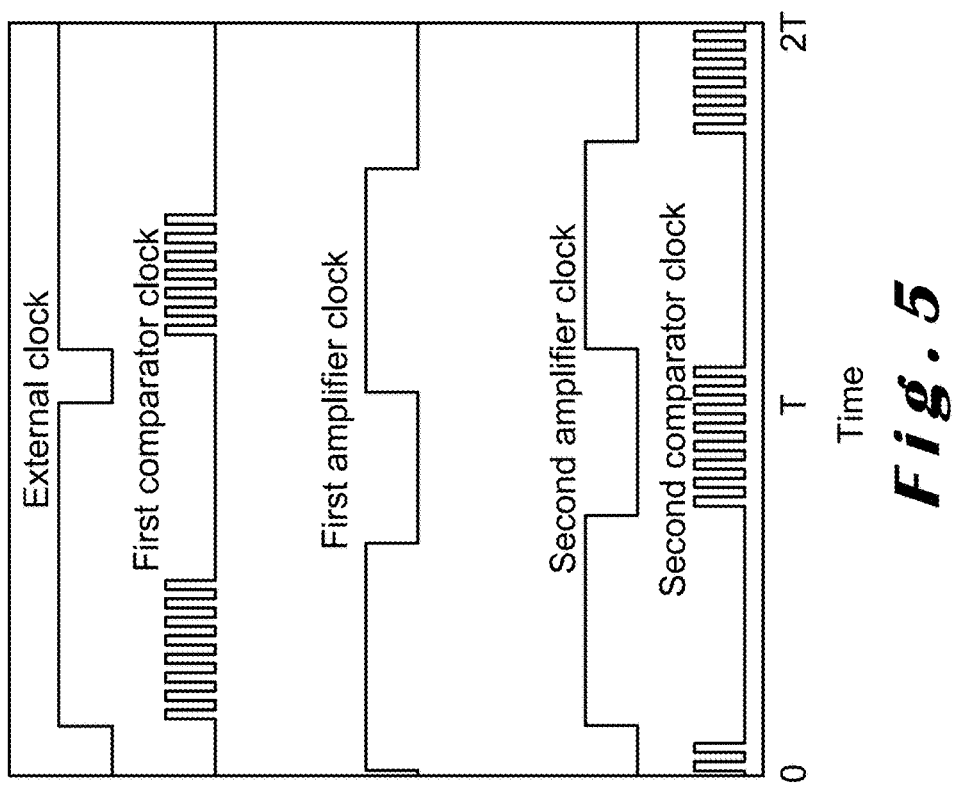
FIG. 5 shows a timing diagram of the two-stage pipelined SAR ADC of FIG. 2A during an offset calibration of the first comparator.

The timing diagram for the two-stage pipelined SAR ADC 200 in this calibration method is shown in FIG. 5. It is clear that there is only one extra comparison done by the first comparator 216, while the rest of the timing remains similar to normal operation (shown in FIG. 3). The additional comparison results in one calibration bit $B^*_{MSB}$ (shown in a dotted line in FIG. 2A) which is sent to the difference calculation module 247.

The difference calculation module 247 then calculates the difference and detects if there is an error. After the error has been detected, i.e., if the last two bits, i.e., the last bit of the MSBs in $C_{OUT}$ and $B^*_{MSB}$, either form '00' or '11', the error needs to be corrected. This correction is done by tuning a first variable capacitance module 218b in the offset correction module 218 in the first SAR ADC 210. Specifically, if the bits form '00' a correction signal is sent to decrease the capacitance, while if the bits form '11' a correction signal is sent to increase the capacitance. This signal is indicated by the dotted line in FIG. 2A termed 'correction'.

Background DAC mismatch calibration, background gain error calibration and background comparator offset error calibration will now be described separately in more detail. It will readily be understood that each type of background calibration can be used alone or in combination with one or more of the other types of background calibration.

Elements or components previously described with reference to FIGS. 2A to 2E bear the same last two digits but preceded by a '7' (FIGS. 6A to 6E).

Figure 6A:
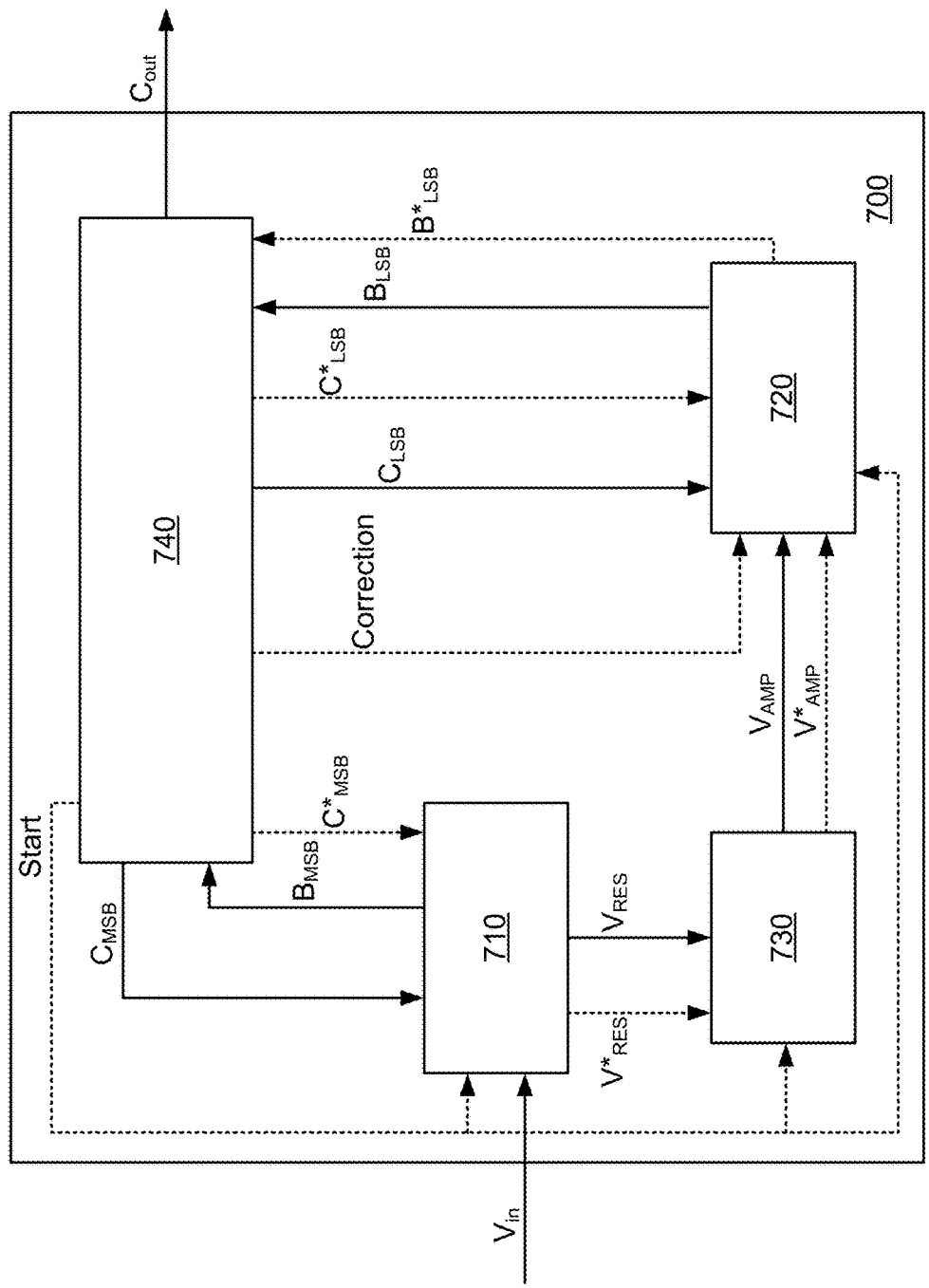
FIG. 6A shows a block diagram of a two-stage pipelined SAR ADC according to the disclosed technology with a gain error calibration.

FIG. 6A shows a block diagram of a two-stage pipelined SAR ADC 700 according to the disclosed technology. The two-stage pipelined SAR ADC 700 only comprises a gain error calibration. The two-stage pipelined SAR ADC 700 comprises a first SAR ADC 710, a second SAR ADC 720, a gain module 730, and a control module 740. The normal operation of the two-stage pipelined SAR ADC 700 is the same as the normal operation of the two-stage pipelined SAR ADC 200 described above with reference to FIGS. 2A to 2E and having the same timing diagram as shown in FIG. 3.

Moreover, the operation of the two-stage pipelined SAR ADC 700 during a gain error calibration is also the same as described above with respect to the two-stage pipelined SAR ADC 200. Therefore, the same timing diagram (as shown in FIG. 4) applies. The main differences between the two-stage pipelined SAR ADC 700 and the two-stage pipelined SAR ADC 200 are that the two-stage pipelined SAR ADC 700 comprises fewer modules and fewer connections between the modules.

Specifically, during the gain error calibration, the input signal $V_{IN}$ is sent to the first SAR ADC 710 which generates the MSBs of a digital signal corresponding to the input signal and outputs the residue signal $V_{RES}$. Moreover, the first SAR ADC 710 also receives the calibration code $C^*_{MSB}$ on the basis of which the calibration residue signal $V^*_{RES}$ is calculated. The gain module 730 amplifies both these the residue and calibration residue signals and outputs both the amplified signals $V_{AMP}$ and the amplified calibration residue signal $V^*_{AMP}$ to the second SAR ADC 720. Based on the amplified signal the second SAR ADC 720 determines the LSBs of the input signal $V_{IN}$. After determining the first LSB, the control module 740 determines the calibration code $C^*_{DET}$ comprising the calibration code $C^*_{MSB}$, and, after all LSBs are determined, also $C^*_{LSB}$. Upon receiving the calibration code $C^*_{LSB}$ and the amplified calibration signal $V^*_{AMP}$, the second SAR ADC 720 calculates the calibration bit $B^*_{LSB}$ that is used in the control module to determine if there is a gain error. If there is a gain error, the control module 740 also provides a correction signal that is transmitted to the second SAR ADC 720.

Figure 6B:
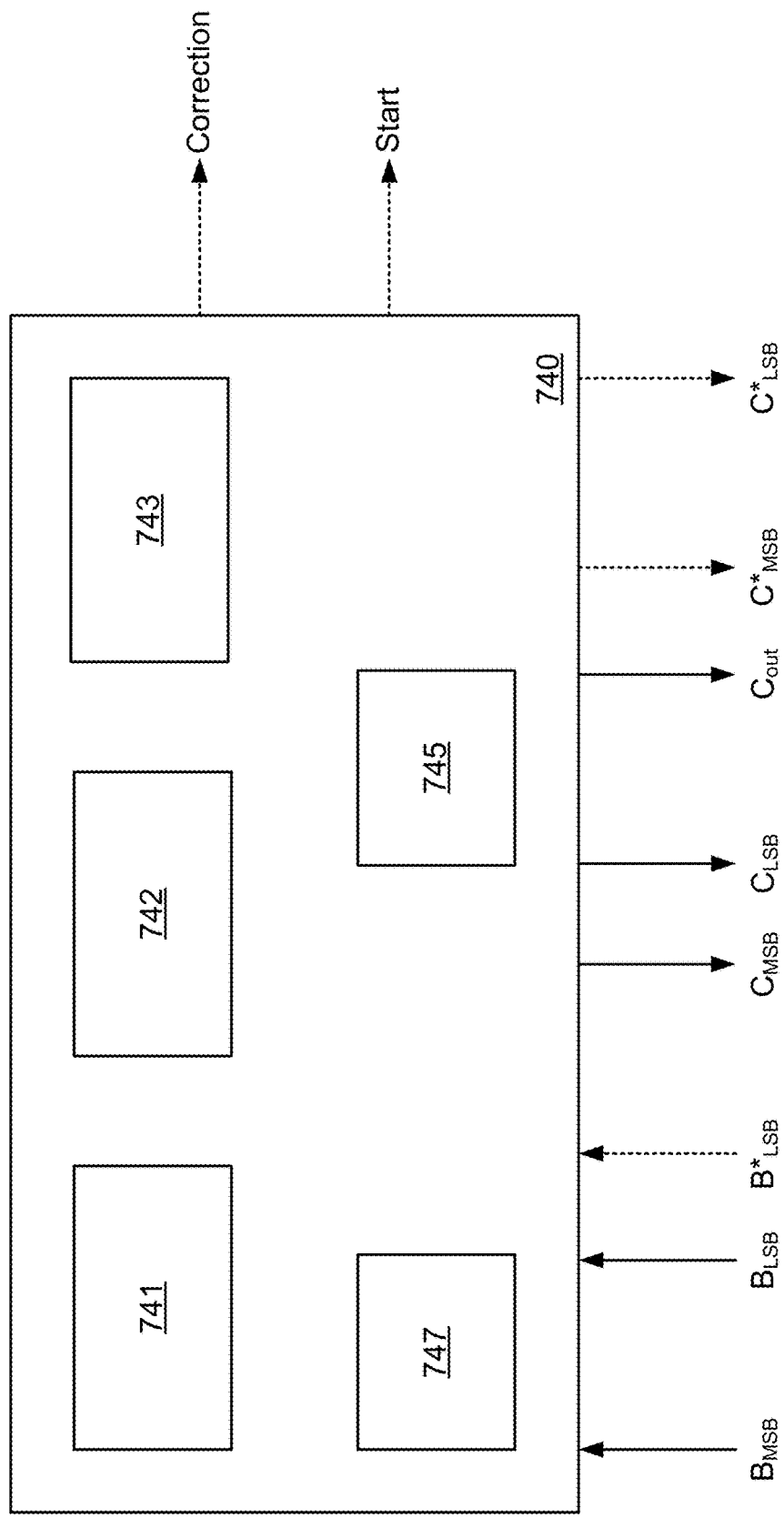
FIG. 6B shows a block diagram of the control module of the two-stage pipelined SAR ADC of FIG. 6A.
Figure 6C:
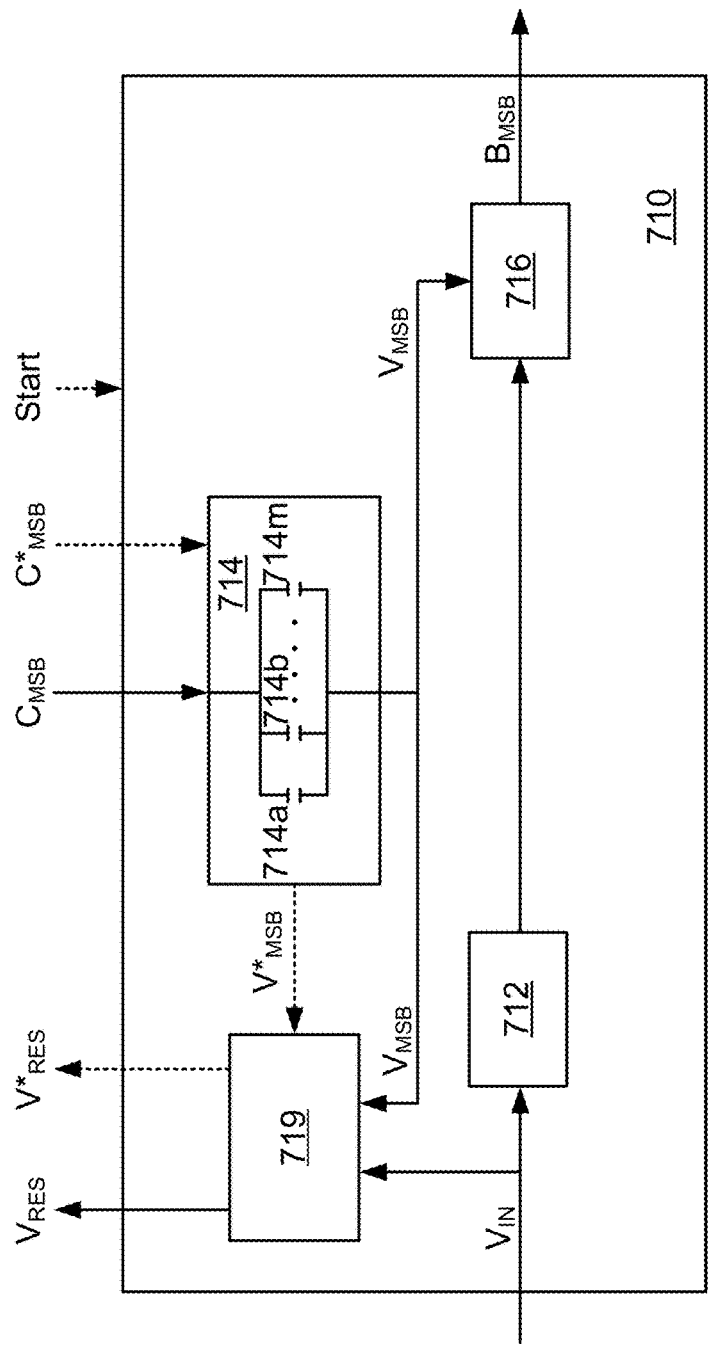
FIG. 6C shows a block diagram of the first SAR ADC of the two-stage pipelined SAR ADC of FIG. 6A.

As shown in FIG. 6B, the control module 740 comprises an interface module 741, a memory module 742, a detection module 743, an amplifier gain calibration module 745, and a difference calculation module 747. These modules perform the same functions as already described above with respect to the gain error calibration of the two-stage pipelined SAR ADC 200. However, the memory module 742 now only stores codes $C_{DET}$ and $C^*_{DET}$ that trigger a gain error calibration. The codes $C_{DET}$ and $C^*_{DET}$ can be the same codes that were described above for the gain error calibration. However, as only the gain error calibration is performed, the codes $C_{DET}$ and $C^*_{DET}$ do not have to satisfy the limitation that they do not coincide with pre-set binary codes that would trigger a DAC mismatch calibration as these codes are not used in the two-stage pipelined SAR ADC 700 because there is no DAC mismatch calibration.

FIG. 7C shows details of the first SAR ADC 710. This first SAR ADC 710 is very similar to the first SAR ADC 610. The main difference between the first SAR ADC 710 and the first SAR ADC 210 is that the first comparator offset calibration module 218 is not present as there is no offset calibration in the two-stage pipelined SAR ADC 700.

The first SAR ADC 710 comprises a Track-and-Hold module 712, a first DAC 714 with capacitors 714a, 714b, . . . , 714m, a first comparator 716, and a residue generation module 719. In particular, the capacitors 714a, 714b, . . . , 714m do not need to be tuneable in this embodiment as there is no DAC mismatch calibration. There is therefore also no incoming 'correction' signal. Further, these modules perform the same functions as already described above with respect to the gain error calibration of the two-stage pipelined SAR ADC 200 (FIG. 2C).

Figure 6D:
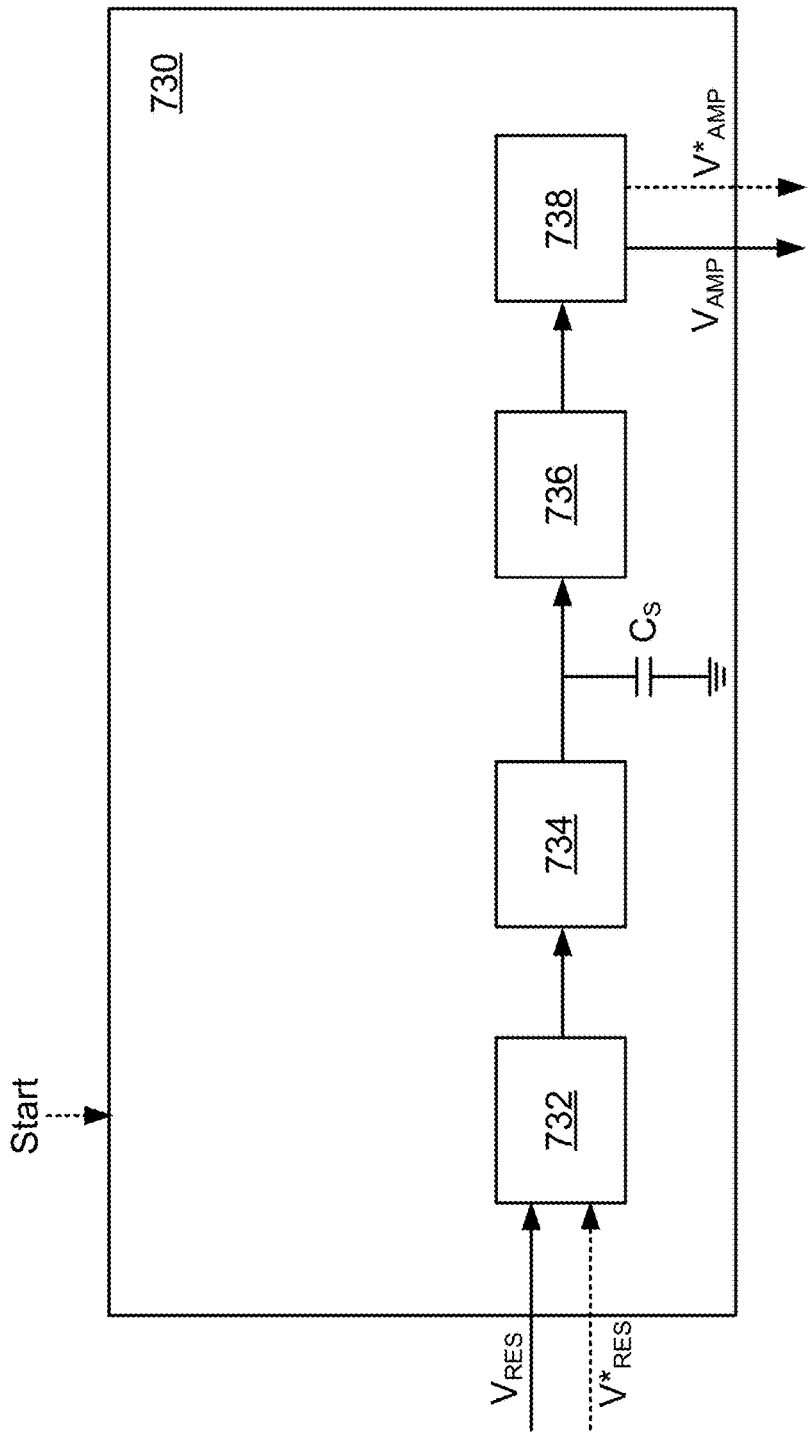
FIG. 6D shows a block diagram of the gain module of the two-stage pipelined SAR ADC of FIG. 6A.

FIG. 6D shows the details of the gain module 730. This gain module 730 is identical to the gain module 630 and, as such, the main difference between the gain module 730 and the gain module 230 is that the comparator offset calibration module 231 is not present as there is no offset calibration in the two-stage pipelined SAR ADC 700.

The gain module 730 comprises first amplifier 732, a second amplifier 736, a first switch 734, a capacitor $C_S$, and a second switch 738. As described with respect to the gain module 230, these modules perform the same function in that they amplify the residue signal and are able to store a signal temporarily on the capacitor $C_s$ which allows the second SAR ADC 720 to finish determining the LSBs of the input signal before having to perform an additional comparison to determine the calibration bit $B^*_{LSB}$.

Figure 6E:
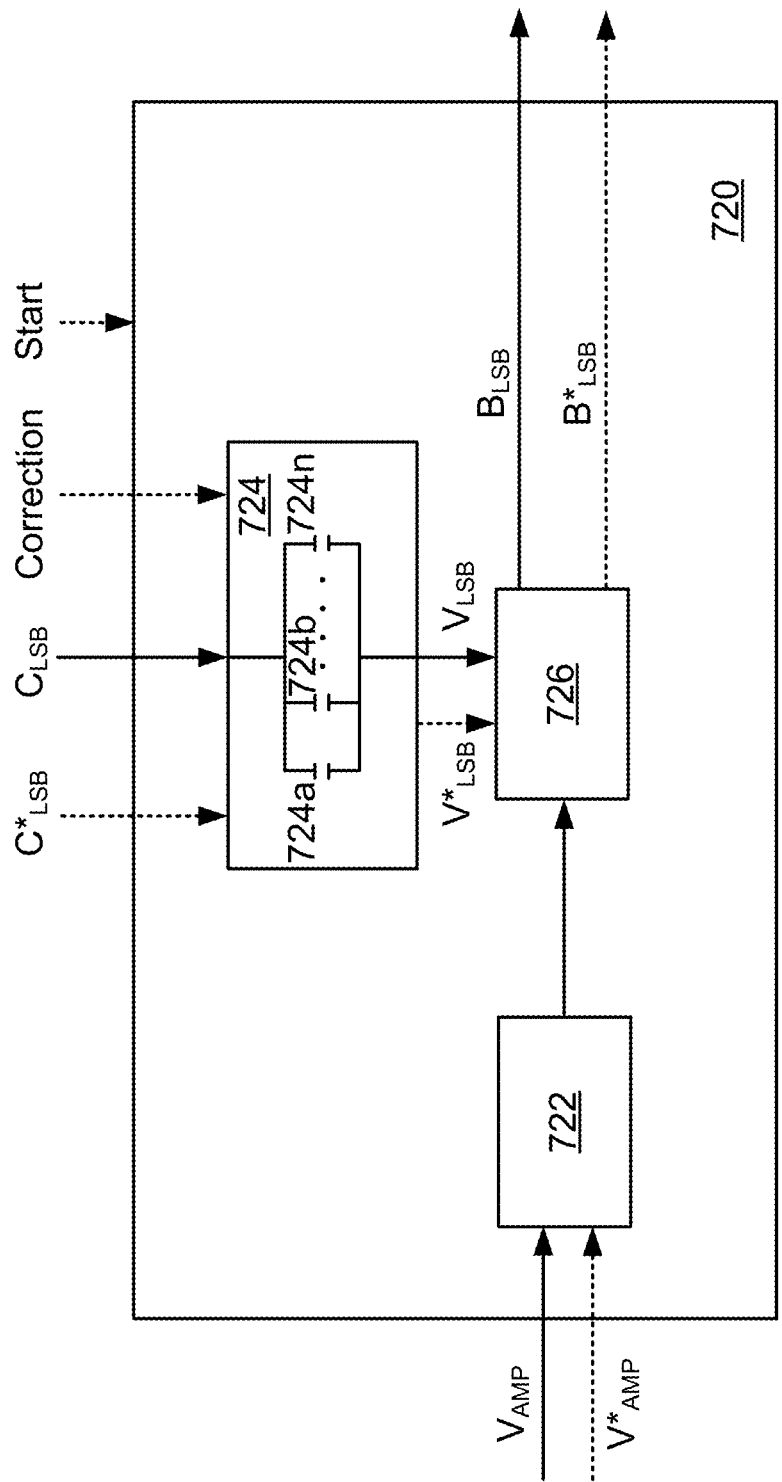
FIG. 6E shows a block diagram of the second SAR ADC of the two-stage pipelined SAR ADC of FIG. 6A.

FIG. 6E shows of the second SAR ADC 720. This SAR ADC 720 is identical to the second SAR ADC 220. The second SAR ADC 720 comprises a Track-and-Hold module 722, a second DAC 724, and a second comparator 726. Moreover, the capacitors 724a, 724b, . . . , 724n in the second DAC 724 are tuneable as gain error correction, sent in the correction signal, is used to increase or decrease the capacity of at least one of the capacitors 724a, 724b, . . . , 724n.

Although aspects of the disclosed technology have been described with respect to specific embodiments, it will be readily appreciated that these aspects may be implemented in other forms.

What is claimed is:

1. A method of gain calibration in a successive approximation register analog-to-digital converter, SAR ADC, the method comprising:
   determining, by a first stage ADC, a number of most significant bits ($B_{MSB}$) of a digital signal ($C_{OUT}$) corresponding to an analog input signal ($V_{IN}$);
   amplifying, by a gain module, a residue signal ($V_{RES}$) output from the first stage ADC; and
   determining, by a second stage ADC, a number of least significant bits ($B_{LSB}$) of the digital signal ($C_{OUT}$) corresponding to the analog input signal ($V_{IN}$);
   detecting if a binary code determined from the analog input signal ($V_{IN}$) matches at least one trigger code;
   using at least one setting code corresponding to the at least one trigger code to determine a calibration residue signal ($V^*_{RES}$) in the first stage ADC and a calibration bit ($B^*_{LSB}$) in the second stage ADC;
   analyzing a least significant bit of the digital signal ($C_{OUT}$) and the calibration bit ($B^*_{LSB}$);
   determining, from the analysis, an indication of a presence of gain error in the gain module; and
   calibrating gain error in the gain module if the presence of gain error is determined.

2. The method according to claim 1, wherein the step of using at least one setting code further comprises determining the calibration residue signal ($V^*_{RES}$) by calculating a difference between the analog input signal ($V_{IN}$) and an analog signal ($V^*_{MSB}$) representing a part of the at least one setting code.

3. The method according to claim 1, wherein the step of using at least one setting code further comprises determining the calibration bit ($B^*_{LSB}$) by comparing an amplified calibration residue signal ($V^*_{AMP}$) to a further analog signal ($V^*_{LSB}$) representing a part of the at least one setting code.

4. The method according to claim 1, wherein the step of using at least one setting code further comprises temporarily storing, by the gain module, the calibration residue signal ($V^*_{RES}$) until the least significant bit has been determined.

5. The method according to claim 1, wherein the step of determining an indication of a presence of gain error further comprises determining if the least significant bit and the calibration bit ($B^*_{LSB}$) are different indicating the presence of gain error in the gain module.

6. The method according to claim 5, wherein the step of determining an indication of a presence of gain error further comprises determining the value of the least significant bit, and, if it has a value of 1, indicating a downwards calibration, and, if it has a value of 0, indicating an upwards calibration.

7. The method according to claim 1, wherein the step of determining an indication of a presence of gain error further comprises determining the value of the least significant bit and of the calibration bit ($B^*_{LSB}$), and, if the value of both the least significant bit and the calibration bit ($B^*_{LSB}$) is 0, not indicating the presence of gain error in the gain module, and, if the value of both the least significant bit and the calibration bit ($B^*_{LSB}$) is 1, not indicating the presence of gain error in the gain module, and if the value of the least significant bit is 0 and the value of the calibration bit ($B^*_{LSB}$) is 1, indicating the presence of gain error in the gain module with an upwards calibration, and if the value of the least significant bit is 1 and the value of the calibration bit ($B^*_{LSB}$) is 0, indicating the presence of gain error in the gain module with a downwards calibration.

8. The method according to claim 1, wherein the step of calibrating gain error in the gain module further comprises, upon detecting presence of gain error in the gain module, calibrating the second stage ADC by adjusting at least one of a plurality of tunable capacitors.

9. A successive approximation register analog-to-digital converter, SAR ADC, comprising:
 a first stage ADC configured for determining a number of most significant bits ($B_{MSB}$) of a digital signal ($C_{OUT}$) corresponding to an analog input signal ($V_{IN}$) and for outputting a residue signal ($V_{RES}$) corresponding to a number of least significant bits ($B_{LSB}$) of the digital signal ($C_{OUT}$);
 a gain module configured for receiving the residue signal ($V_{RES}$) output from the first stage ADC, for amplifying the residue signal ($V_{RES}$) and for outputting the amplified residue signal ($V_{AMP}$);
 a second stage ADC configured for receiving the amplified residue signal ($V_{AMP}$) and for determining a number of least significant bits ($B_{LSB}$) of the digital signal ($C_{OUT}$) corresponding to the input analog signal ($V_{IN}$) from the amplified residue signal ($V_{AMP}$); and
 a control module configured for controlling the first stage ADC, the gain module, and the second stage ADC, and for outputting the digital output signal ($C_{OUT}$) corresponding to the input analog signal ($V_{IN}$);
 wherein the control module is further configured for:
 storing at least one trigger code;
 detecting if a binary code determined from the analog input signal ($V_{IN}$) matches the at least one trigger code;
 providing at least one setting code corresponding to the at least one trigger code to the first stage ADC that is further configured for determining a calibration residue signal ($V^*_{RES}$), and, to the second stage ADC that is further configured for determining a calibration bit ($B^*_{LSB}$);
 analyzing a least significant bit of the digital signal ($C_{OUT}$) and the calibration bit ($B^*_{LSB}$);
 determining, from the analysis, an indication of a presence of gain error in the gain module; and
 initiating calibrating gain error in the gain module if the presence of gain error is determined.

10. The SAR ADC according to claim 9, wherein the first stage ADC comprises a residue generation module that is configured for determining the calibration residue signal ($V^*_{RES}$) by calculating a difference between the analog input signal ($V_{IN}$) and an analog signal ($V^*_{MSB}$) representing a part of the at least one setting code.

11. The SAR ADC according to claim 9, wherein the second stage ADC comprises a comparator configured for determining the calibration bit ($B^*_{LSB}$) by comparing an amplified calibration residue signal ($V^*_{AMP}$) to a further analog signal ($V^*_{LSB}$) representing a part of the at least one setting code.

12. The SAR ADC according to claim 9, wherein the gain module comprises: a first amplifier, a second amplifier, a first switch between the first amplifier and the second amplifier, and a second switch after the second amplifier, the control module controlling the first switch and the second switch to store temporarily the calibration residue signal ($V^*_{RES}$) on a capacitor ($C_S$) after the first switch until the second stage ADC has determined the least significant bit.

13. The SAR ADC according to claim 9, wherein the control module further comprises a difference calculation module configured for determining if the least significant bit and the calibration bit ($B^*_{LSB}$) are different indicating the presence of gain error in the gain module.

14. The SAR ADC according to claim 13, wherein the control module comprises a gain calibration module configured for determining the value of the least significant bit, and, if it has a value of 1, indicating a downwards calibration, and, if it has a value of 0, indicating an upwards calibration.

15. The SAR ADC according to claim 9, wherein the control module is further configured to send a signal indicating the presence of gain error in the gain module to the second stage ADC that comprises a plurality of tunable capacitors configured to be adjusted in accordance with the signal.

16. The SAR ADC according to claim 10, wherein the second stage ADC comprises a comparator configured for determining the calibration bit ($B^*_{LSB}$) by comparing an amplified calibration residue signal ($V^*_{AMP}$) to a further analog signal ($V^*_{LSB}$) representing a part of the at least one setting code.

17. The SAR ADC according to claim 10, wherein the gain module comprises: a first amplifier, a second amplifier, a first switch between the first amplifier and the second amplifier, and a second switch after the second amplifier, the control module controlling the first switch and the second switch to store temporarily the calibration residue signal ($V^*_{RES}$) on a capacitor ($C_S$) after the first switch until the second stage ADC has determined the least significant bit.

18. The SAR ADC according to claim 10, wherein the control module further comprises a difference calculation module configured for determining if the least significant bit and the calibration bit ($B^*_{LSB}$) are different indicating the presence of gain error in the gain module.

19. The SAR ADC according to claim 18, wherein the control module comprises a gain calibration module configured for determining the value of the least significant bit, and, if it has a value of 1, indicating a downwards calibration, and, if it has a value of 0, indicating an upwards calibration.

20. The SAR ADC according to claim 10, wherein the control module is further configured to send a signal indicating the presence of gain error in the gain module to the second stage ADC that comprises a plurality of tunable capacitors configured to be adjusted in accordance with the signal.

* * * * *